United States Patent
Chi

(10) Patent No.: US 9,573,783 B2
(45) Date of Patent: Feb. 21, 2017

(54) SPLICING DEVICE AND SPLICING METHOD

(75) Inventor: Xiao Dong Chi, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 178 days.

(21) Appl. No.: 14/389,145

(22) PCT Filed: Apr. 18, 2012

(86) PCT No.: PCT/JP2012/060513
§ 371 (c)(1),
(2), (4) Date: Oct. 27, 2014

(87) PCT Pub. No.: WO2013/157107
PCT Pub. Date: Oct. 24, 2013

(65) Prior Publication Data
US 2015/0060590 A1   Mar. 5, 2015

(51) Int. Cl.
B65H 20/20   (2006.01)
B65H 19/18   (2006.01)
H05K 13/02   (2006.01)

(52) U.S. Cl.
CPC .......... *B65H 19/1852* (2013.01); *B65H 20/20* (2013.01); *H05K 13/021* (2013.01); *B65H 2301/461* (2013.01); *B65H 2301/4622* (2013.01); *B65H 2301/4631* (2013.01); *B65H 2301/46222* (2013.01); *B65H 2401/15* (2013.01); *B65H 2511/512* (2013.01); *B65H 2701/1942* (2013.01)

(58) Field of Classification Search
CPC ............ B65H 19/1852; B65H 19/1873; B65H 2301/46174; B65H 20/20; B65H 2301/4631
See application file for complete search history.

(56) References Cited

U.S. PATENT DOCUMENTS

| 5,259,911 A | 11/1993 | Ohnishi et al. |
| 6,694,606 B1 | 2/2004 | Ohashi et al. |
| 2015/0053809 A1* | 2/2015 | Chi ............... H05K 13/021 242/553 |

FOREIGN PATENT DOCUMENTS

| JP | 4 339713 | 11/1992 |
| JP | 6 79788 | 3/1994 |
| JP | 2000 13092 | 1/2000 |

(Continued)

OTHER PUBLICATIONS

International Search Report Issued Jun. 5, 2012 in PCT/JP12/060513 Filed Apr. 18, 2012.

*Primary Examiner* — Sang Kim
(74) *Attorney, Agent, or Firm* — Oblon, McClelland, Maier & Neustadt, L.L.P.

(57) ABSTRACT

A splicing device and splicing method in which automatic and accurate splicing is performed by inserting two carrier tapes into the device. The splicing device including cutting devices for cutting the tail end of number one carrier tape and the leading end of number two carrier tape at a predetermined cutting position; a positioning device for indexing number one and number two carrier tapes towards each other respectively to splicing position at which positioning pins engage with indexing holes of the number one and number two carrier tapes; and a joining device which, with splicing tape affixed to connected protective tape positioned at the splicing position, folds protective tape and joins the splicing tape to both surfaces of number one and number two carrier tapes straddling thereof.

5 Claims, 25 Drawing Sheets

(56) References Cited

FOREIGN PATENT DOCUMENTS

| | | |
|---|---|---|
| JP | 2002 207286 | 7/2002 |
| JP | 2006 49337 | 2/2006 |
| JP | 2007 335595 | 12/2007 |
| JP | 2008 305849 | 12/2008 |
| JP | 2010 120344 | 6/2010 |
| JP | 2011 159677 | 8/2011 |

* cited by examiner (A)

(B)

(C)

SPLICING DEVICE AND SPLICING METHOD

TECHNICAL FIELD

The present invention relates to a splicing device and splicing method for automatically connecting the tail end and leading end of two carrier tapes.

BACKGROUND ART

Typically for component mounters, a carrier tape holding multiple electronic components at fixed intervals is wound onto a reel, and by moving a sprocket which engages in indexing holes provided in the carrier tape, the carrier tape is indexed a fixed amount each time so that an electronic component is supplied to a supply position, and the component is picked up by a suction nozzle and mounted onto a circuit board.

For this type of component mounter, when the remaining quantity of electronic components held in one reel becomes small, the leading end of a carrier tape wound around a different reel which holds the same type of electronic component is connected using splicing tape to the tail end of the carrier tape for which the remaining quantity has become small, in other words, splicing is performed. An item with this type of splicing function is disclosed, for example, in PTL 1.

CITATION LIST

Patent Literature

PTL 1: JP-A-2007-335595

SUMMARY OF INVENTION

Technical Problem

However, because splicing is currently performed by manual work, there is a risk of the pitch of the connection section of the two carrier tapes being deviated, leading to errors occurring during image processing when picking up electronic components, due to the end of a carrier tape being cut at an angle or a gap being created in the connection section. Further, especially when the electronic components are small, there is a risk that the electronic components cannot be picked up and pickup errors occurring due to deviation in the pitch of the connection sections.

Also, because it is manual work, there is the problem that splicing requires a lot of time, so splicing work cannot be completed while the machine is operating, which means that the component mounter must be stopped, thereby lowering production efficiency.

The present invention is an item which solves the above current problems whose object is a splicing device and splicing method which can perform splicing automatically and accurately by two carrier tapes being inserted into the device.

Solution to Problem

In order to solve the above problems, the invention from claim 1 is a splicing device which connects number one carrier tape and number two carrier tape provided with cavities for storing components and indexing holes at fixed intervals using splicing tape, comprising: number one and number two cutting devices for respectively cutting at a predetermined cutting position the tail end of number one carrier tape and the leading end of number two carrier tape; a positioning device for indexing number one and number two carrier tapes cut by the number one and two cutting devices in a direction towards each other and for positioning them at a splicing position at which positioning pins engage in the indexing holes of number one carrier tape and the indexing holes of number two carrier tape; and a joining device which, at the splicing position, uses splicing tape indexed in a direction perpendicular to the indexing direction of the number one and number two carrier tapes, wherein the splicing tape, with the attachment surface to be connected of number one and number two carrier tapes as the outer side, is affixed using intervals in the length direction of connected protective tape, and with the splicing tape positioned at the splicing position, folds the protective tape and joins the splicing tape to both surfaces of the number one and number two carrier tapes straddling thereof.

According to the above configuration, the cutting of the carrier tapes and the joining with splicing tape for splicing the two carrier tapes can be performed automatically, and it is possible to eliminate deviation in the pitch of the connection sections of the two carrier tapes which arises during conventional manual work. By this, the occurrence of pickup errors and image processing errors due to deviation in the pitch of the connection sections can be controlled.

Further, by performing splicing automatically, the time required for splicing can be reduced, and by this, splicing processing can be completed without stopping the component mounter, and, as well as controlling the occurrence of image processing error and the occurrence of pickup errors, the efficiency of the component mounter can be improved by a large amount.

The invention from claim 2 is the invention from claim 1 characterized in that connected base paper is attached to the attachment surface of the splicing tape, and a supply reel with the base paper, the splicing tape, and the protective tape wound around in a roll shape is used.

According to the above configuration, because the base paper, splicing tape, and protective tape are wound around the supply reel in a roll shape attached to each other, the splicing tape can be continuously indexed by setting the supply reel on the splicing device, and supply of the splicing tape to the splicing position can be performed easily.

The invention from claim 3 is the invention from claim 1 or claim 2 characterized in that metal is embedded in the splicing tape, and the protective tape is indexed a predetermined amount and the position of the splicing tape is determined at the splicing position based on the signal of a metal detection sensor for detecting the metal.

According to the above configuration, because the position of the splicing tape is determined at the splicing position by detecting the metal embedded in the splicing tape with a metal detection sensor, the position of the splicing tape can be accurately determined at the splicing position without being affected by factors such as stretch in the protective tape.

The invention from claim 4 is the invention from any one of claim 1 to claim 3 characterized in that the joining device has an engaging member which engages with the positioning pins or positioning holes of the positioning device.

According to the above configuration, a positioning device which positioned two carrier tapes respectively with positioning pins, and a joining device which positioned protective tape with positioning pins can be engaged with each other in a fixed relationship. By this, when joining the splicing tape, the splicing tape can be joined in an accurate position with respect to the two carrier tapes, and the splicing accuracy can be improved.

The present invention from claim 5 is a splicing method which connects number one carrier tape and number two carrier tape provided with cavities for storing components and indexing holes at fixed intervals using splicing tape, wherein, as well as the tail end of number one carrier tape and the leading end of number two carrier tape being cut respectively at a predetermined cutting position, connected protective tape being indexed in a direction perpendicular to the indexing direction of number one and number two carrier tapes, and the position of splicing tape affixed to the protective tape being determined at the splicing position; the cut number one and number two carrier tapes are indexed in a direction towards each other, the indexing holes of number one carrier tape and the indexing holes of number two carrier tape are engaged with the positioning pins provided at the splicing position, the protective tape is folded back, and the splicing tape is joined to both surfaces of number one and number two carrier tapes straddling thereof.

According to the above configuration, splicing processing for connecting two carrier tapes can be performed automatically, deviation in the pitch of connection sections of carrier tapes which arises during conventional manual work can be eliminated, and the occurrence of pickup errors and image processing errors due to deviation in the pitch of connection sections can be controlled.

DESCRIPTION OF EMBODIMENTS

Figure 1:
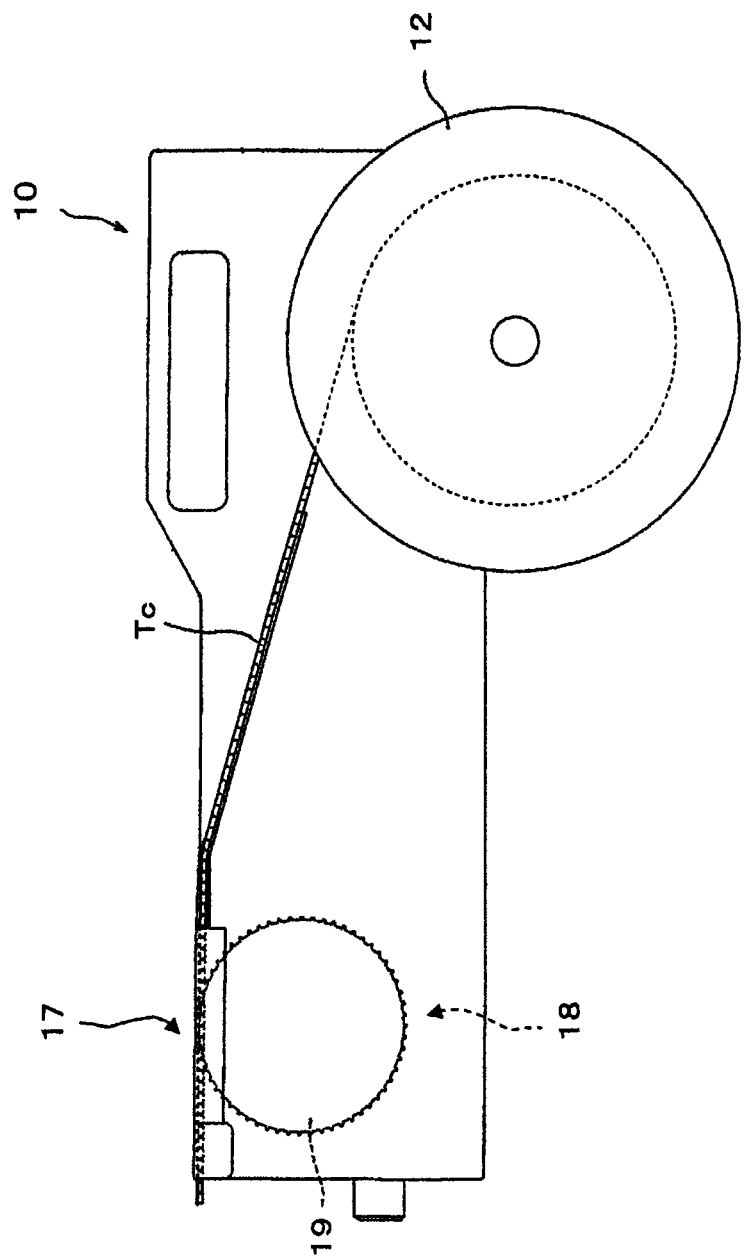
FIG. 1 is a diagram showing a tape feeder suitable for an embodiment of the present invention.

The following describes an embodiment of the present invention based on the figures. FIG. 1 shows tape feeder 10 which is removably loaded onto the component supply device of a component mounter, and reel 12 with carrier tape Tc wound around is removably attached to tape feeder 10.

Figure 2:
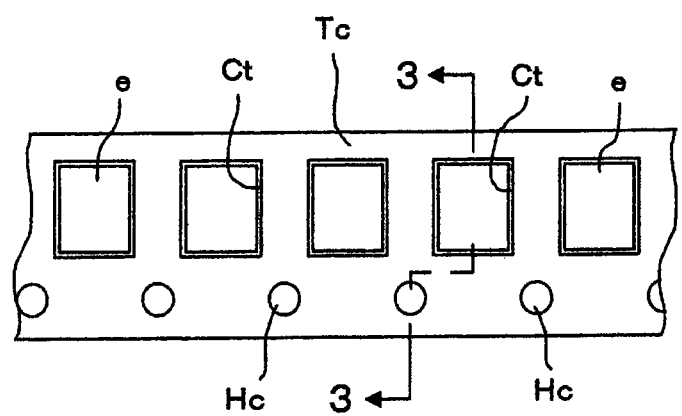
FIG. 2 is a diagram showing carrier tape held in a tape feeder.
Figure 3:
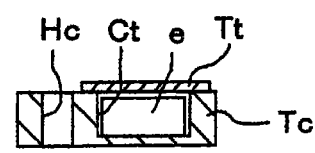
FIG. 3 is a cross section view along line 3-3 of FIG. 2.

Carrier tape Tc, as shown in FIG. 2, is formed in a long, narrow manner with a predetermined width, and is provided with multiple cavities Ct arranged lengthwise at a fixed pitch, and components (electronic components) e to be mounted on a circuit board are stored respectively in these cavities Ct. The upper section of cavities Ct is open and covered by cover tape Tt (refer to FIG. 3) which is affixed to the surface of carrier tape Tc.

Along one edge in the widthwise direction of carrier tape Tc, indexing holes Hc are formed at the same pitch as cavities Ct, or at twice the pitch of cavities Ct, such that these indexing holes Hc have a fixed positional relationship with cavities Ct.

Provided in tape feeder 10 is a fixed amount indexing mechanism 18 for indexing carrier tape Tc wound around reel 12 by fixed amounts and supplying electronic components e one by one to component supply position 17 provided at the tip section of tape feeder 10. Fixed amount indexing mechanism 18 is rotatably provided on the main body of tape feeder 10, and comprises sprocket 19 for engaging with indexing holes Hc of carrier tape Tc and a motor which is omitted from the figures for rotating sprocket 19 one pitch each time.

For carrier tapes Tc used on component mounters, there are multiple types each with different pitches for cavities Ct, and the relationship between indexing holes Hc and the pitch of cavities Ct and cavities Ct is decided based on the type of carrier type Tc. It follows that, as given below, by recognizing the pitch of cavities Ct by image processing or the like, it is possible to know the type of carrier tape Tc, and based on this, the position of indexing holes Hc of carrier tape Tc can be recognized, and the cutting position of carrier tape Tc during splicing can be decided.

Splicing device 20 is a device for automatically connecting the tail end of carrier tape wound around the current reel loaded on tape feeder 10 loaded on the component supply device and the leading end of carrier tape wound around the next reel which is to be exchanged.

Figure 4:
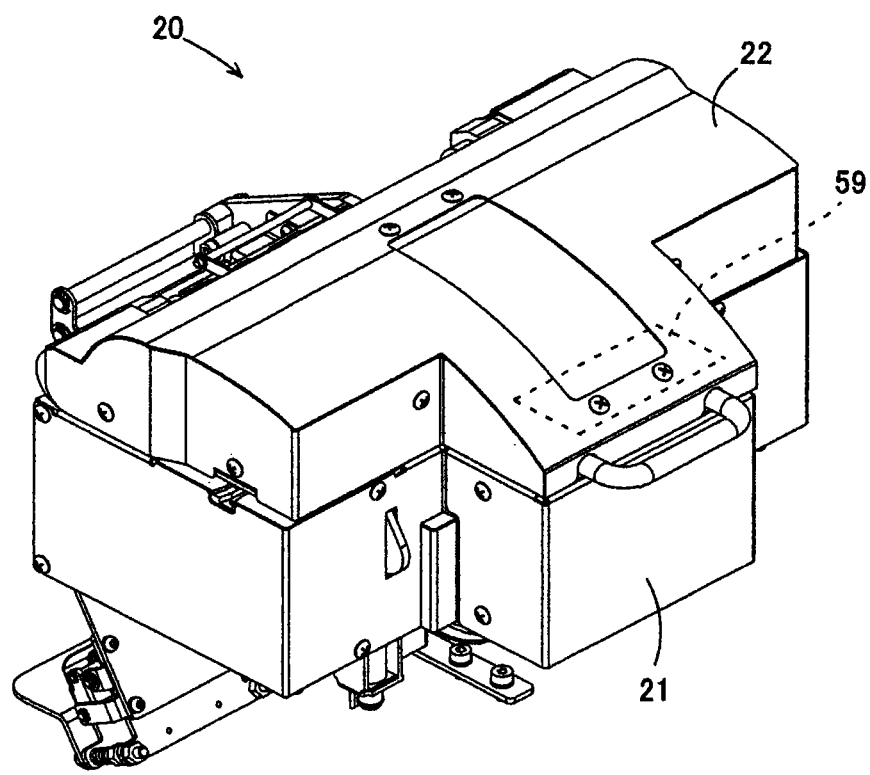
FIG. 4 is a perspective view showing the entire splicing device indicated in the embodiment of the present invention.

Splicing device 20, as shown in FIG. 4, comprises box-like housing 21 and lid 22 on the upper surface of housing 21 which can be opened/closed, and is loaded on a cart and so on which is omitted from the figures to be movable between tape feeders 10 loaded on the component supply device of a component mounter. Lid 22 is closed during splicing and opened when removing carrier tape Tc after splicing.

Figure 11:
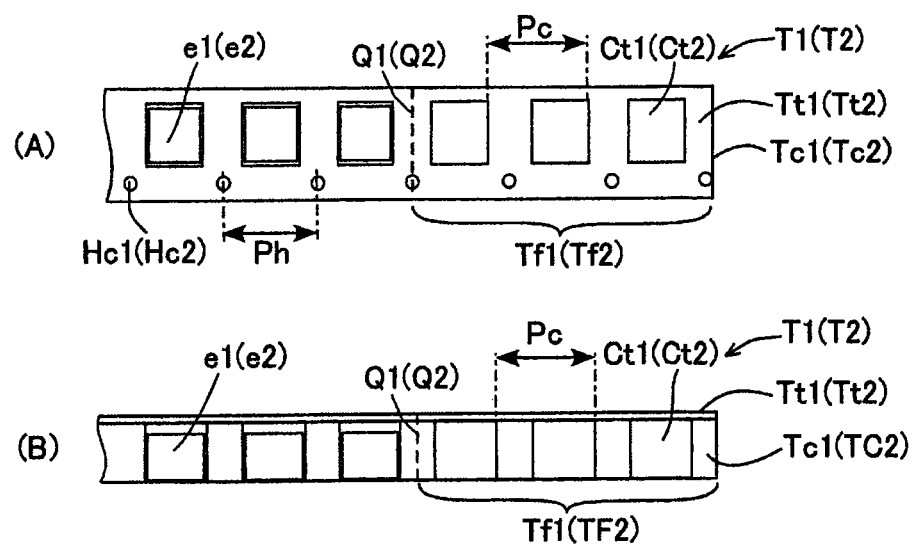
FIG. 11(A) is a top view of carrier tape to be connected in the splicing device and FIG. 11 (B) is the carrier tape viewed from the side.

For the two carrier tapes Tc (hereafter referred to as number one carrier tape T1 and number two carrier tape T2) spliced by splicing device 20, as shown in FIG. 11, as well as number one cavities Ct1 (number two cavity Ct2) in which are stored the same type of components e1 (number two components e2) being provided at predetermined pitch Pc, number one indexing holes Hc1 which can engage with teeth 67a (67b) of number one sprocket 61a (number two sprocket 62b) of number one tape indexing device 50 (number two tape indexing device 51) given below, are formed parallel to number one cavities Ct1 (number two cavities Ct2) at predetermined pitch Ph.

Number one and number two carrier tapes T1 and T2 are cut by splicing device 20 at number one and number two cutting points Q1 and Q2 which can be anywhere and then aligned, and are spliced using splicing tape 30 described below. For number one cutting point Q1 (number two cutting point Q2), for example, the intermediate position between number one cavity Ct1 (number two cavity Ct2) in which there is number one component e1 (number two component e2) and empty number one cavity Ct1 (number two cavity Ct2) in which there is no number one component e1 (number two component e2) is selected. Number one carrier tape T1 (number two carrier tape T2) on which empty number one cavities Ct1 (number two cavities Ct2) lie in a row after cutting is discarded as number one unnecessary section Tf1 (number two unnecessary section Tf2). Here, in order to leave any quantity of empty number one cavities Ct1 (number two cavities Ct2), the intermediate position of adjacent empty number one cavities Ct1 (number two cavity Ct2) can also be selected as number one cutting point Q1 (number two cutting point Q2).

Figure 12:
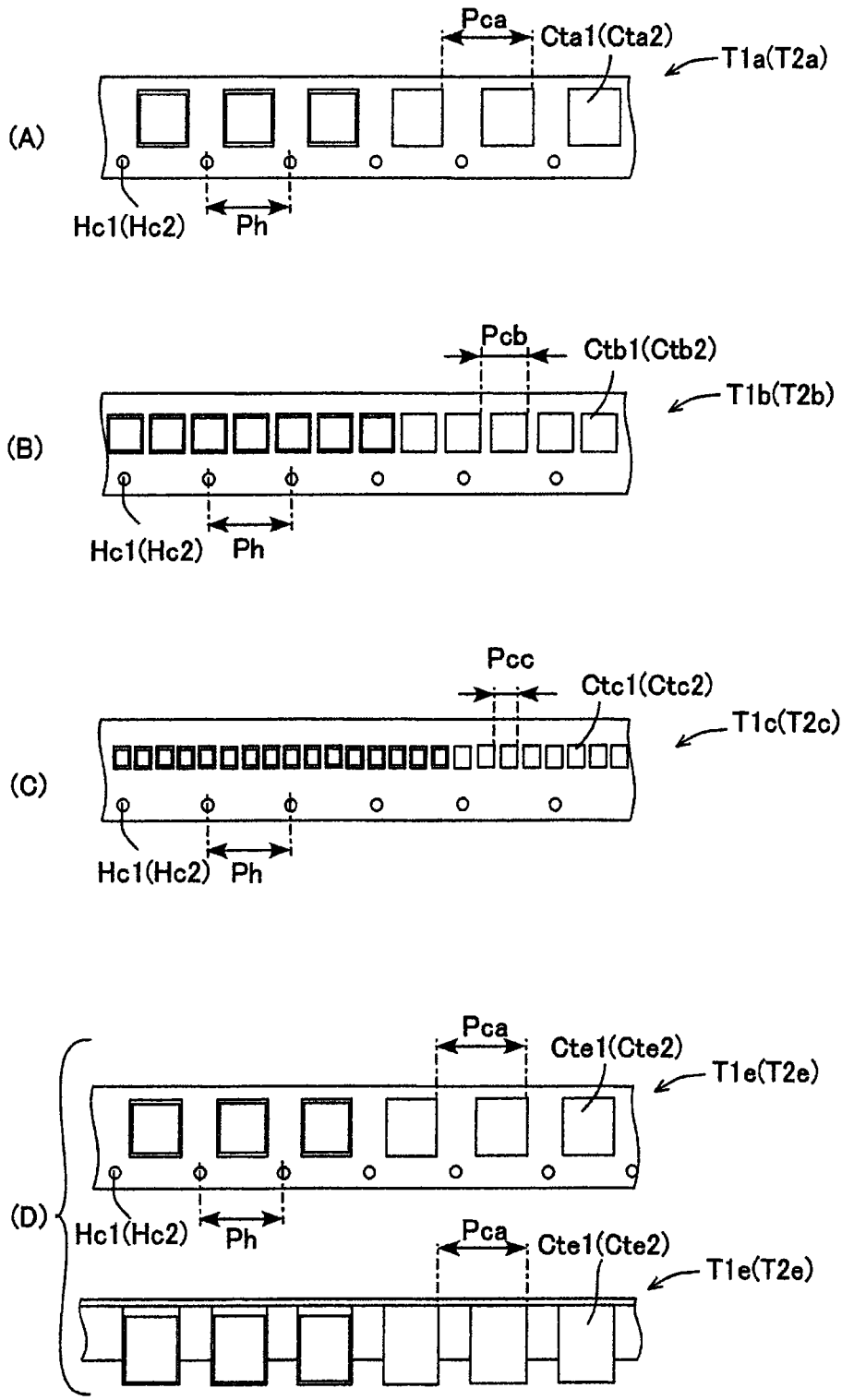
FIG. 12 is a diagram showing the types of carrier tapes which can be connected in the splicing device.

As shown in FIG. 12, as number one carrier tape T1 (number two carrier tape T2) which can be connected in splicing device 20, there are three types of carrier tapes in which number one indexing holes Hc1 (number two indexing holes Hc2) are formed at the same predetermined pitch Ph, but in which number one cavities Ct1 (number two cavities Ct2) are provided at differing pitches Pc (Pca, Pcb, and Pcc). In other words, the first type of number one carrier tape T1a (number two carrier tape T2b) is tape (refer to FIG. 12 [A]) provided with a predetermined pitch Pca (=Ph) such that one number one cavity Cta1 (number two cavity Cta2) is present at the intermediate position of adjacent number one indexing holes Hc1 (number two indexing holes Hc2).

The second type of number one carrier tape T1b (number two carrier tape T2b) is tape (refer to FIG. 12 [B]) provided with a predetermined pitch Pcb (=Ph/2) such that one number one cavity Ctb1 (number two cavity Cta2) each is present at the position matching number one indexing holes Hc1 (number two indexing holes Hc2) and at the intermediate position of adjacent number one indexing holes Hc1 (number two indexing holes Hc2).

The third type of number one carrier tape T1c (number two carrier tape T2c) is tape (refer to FIG. 12 [C]) provided with a predetermined pitch Pcc (=Ph/4) such that one number one cavity Ct1 (number two cavity Cta2) is present at the position matching number one indexing holes Hc1 (number two indexing holes Hc2), and three number one cavities Ctc1 (number two cavities Ctc2) are present between adjacent number one indexing holes Hc1 (number two indexing holes Hc2).

Also, number one embossed tape T1e (number two embossed tape T2e) for which number one cavities Cte1 (number two cavities Cte2) protrude in the thickness direction due to the height of number one component e1 (number two component e2) being tall can be connected by splicing device 20 (refer to FIG. 12 [D]). In the same way as the three types of tape above, number one embossed tape T1e (number two embossed tape T2e) is tape in which number one indexing holes Hc1 (number two indexing holes Hc2) are formed at the same predetermined pitch Ph, but in which number one cavities Cte1 (number two cavities Cte2) are provided at differing pitches Pc (Pca, Pcb, Pcc).

Figure 5:
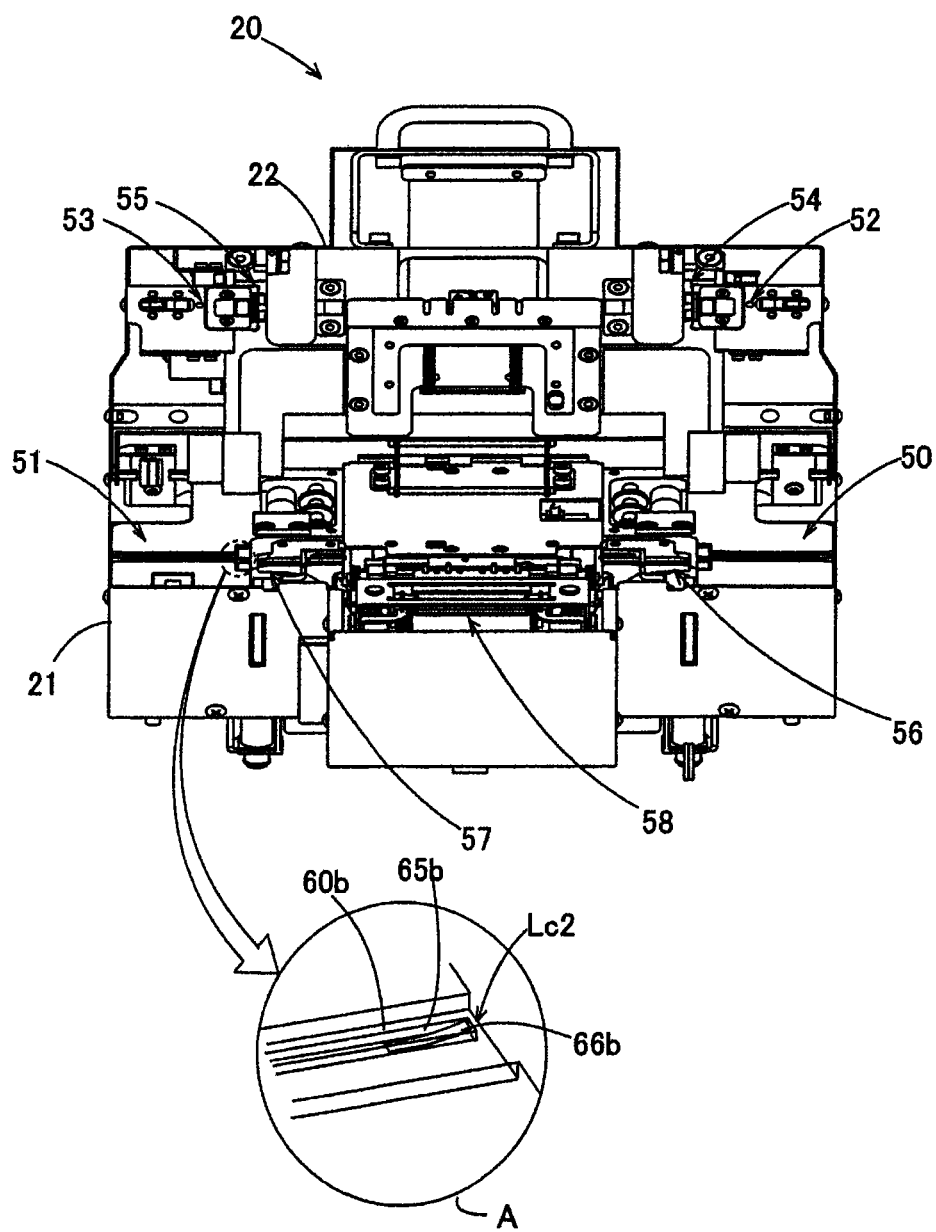
FIG. 5 is a diagram of the splicing device with the lid open.

Splicing device 20, as well as taking in two carrier tapes T1 and T2 to be spliced from the left and right of FIG. 5, takes in, in a perpendicular direction to that, which is the up direction of FIG. 5., protective tape 31 affixed with splicing tape 30 to connect two carrier tapes T1 and T2. Further, the respective ends of two carrier tapes T1 and T2 are joined to each other by splicing tape 30 at splicing position LS at which protective tape 31 and carrier tapes T1 and T2 intersect.

Figure 30:
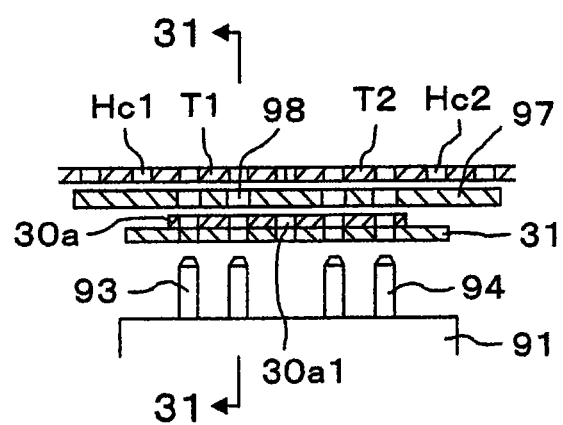
FIG. 30 is a cross section showing the relationship of the carrier tape and splicing tape at the splicing position.

Here, splicing tape 30 affixed to protective tape 31, as shown in FIG. 30, is taken in to splicing position LS with the attachment surface facing up and two carrier tapes T1 and T2 are positioned above this splicing tape 30.

Figure 8:
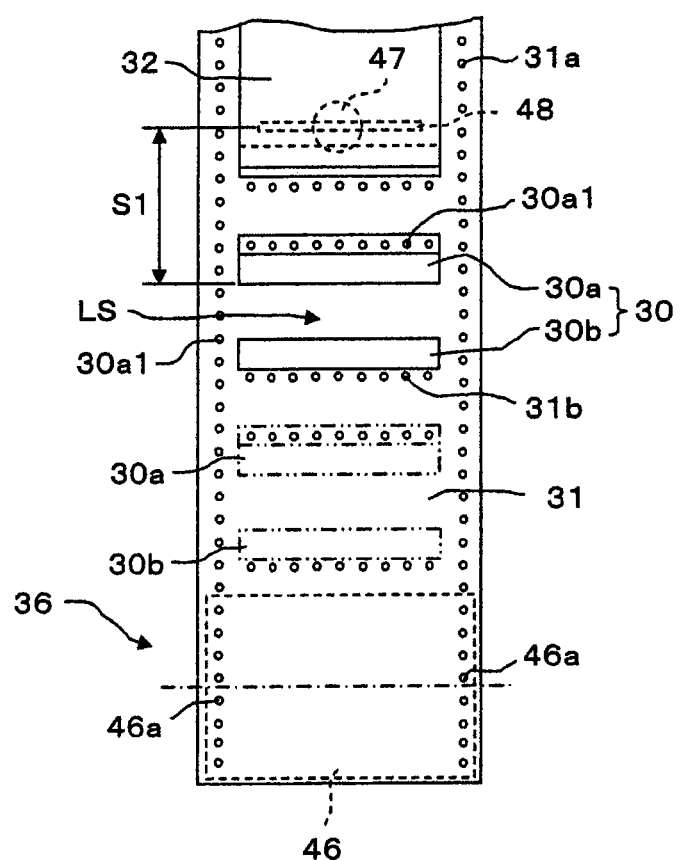
FIG. 8 is a diagram showing the affixing state of the splicing tape on the protective tape.

For splicing tape 30, as shown in FIG. 8, on the upper surface of connected protective tape 31, two pieces, splicing tape 30a and splicing tape 30b, which make up one set to be attached to both sides of two carrier tapes T1 and T2 and straddling thereof, are affixed at a predetermined interval in the lengthwise direction of protective tape 31. Multiple of these two pieces of splicing tape 30a and 30b are affixed at predetermined intervals in the lengthwise direction of protective tape 31.

Figure 7:
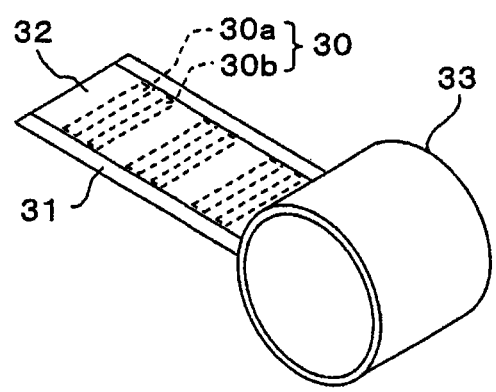
FIG. 7 is a diagram showing the supply reel wound with splicing tape which is used in the splicing device.
Figure 9:
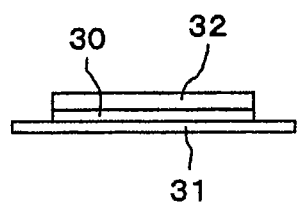
FIG. 9 is a diagram showing the attached state of the protective tape, splicing tape, and base paper.

The upper surface of splicing tapes 30a and 30b consists of an attachment surface to be attached to both surfaces of two carrier tapes T1 and T2 and straddling thereof, and on this attachment surface, connected base paper 32 is attached, and the three-layer structure (refer to FIG. 9) of these base paper 32, splicing tape 30, and protective tape 31 is, as shown in FIG. 7, wound around supply reel 33 in a roll shape.

The width dimension of protective tape 31 is larger than the width dimension of base paper 32, and the edges of protective tape 31 in the width direction protrude from the edges of base paper 32 in the width direction, and holes 31a for indexing the protective tape are formed at fixed intervals in the lengthwise direction in those protruding sections. On the other hand, the width dimension of splicing tape 30 is the same as the width dimension of base paper 32, and splicing tapes 30 with two pieces as one set are affixed to protective tape 31 along the width direction inside holes 31a for indexing. Positioning holes 30a1 are respectively formed in splicing tape 30a which is one of the two pieces of one set at the same pitch as indexing holes Hc1 and Hc2 formed in carrier tapes T1 and T2, and positioning holes 31b are respectively formed in protective tape 31 at the same pitch as indexing holes Hc1 and Hc2 formed in carrier tapes T1 and T2 at a position adjacent to splicing tape 30b which is the other of the two pieces of one set.

Here, holes 31a for indexing and positioning holes 31b formed in protective tape 31 are formed by a punching press or the like after splicing tapes 30a and 30b are affixed to protective tape 31 in a specified position so to be aligned with positioning holes 30a1 formed in splicing tape 30a.

Figure 6:
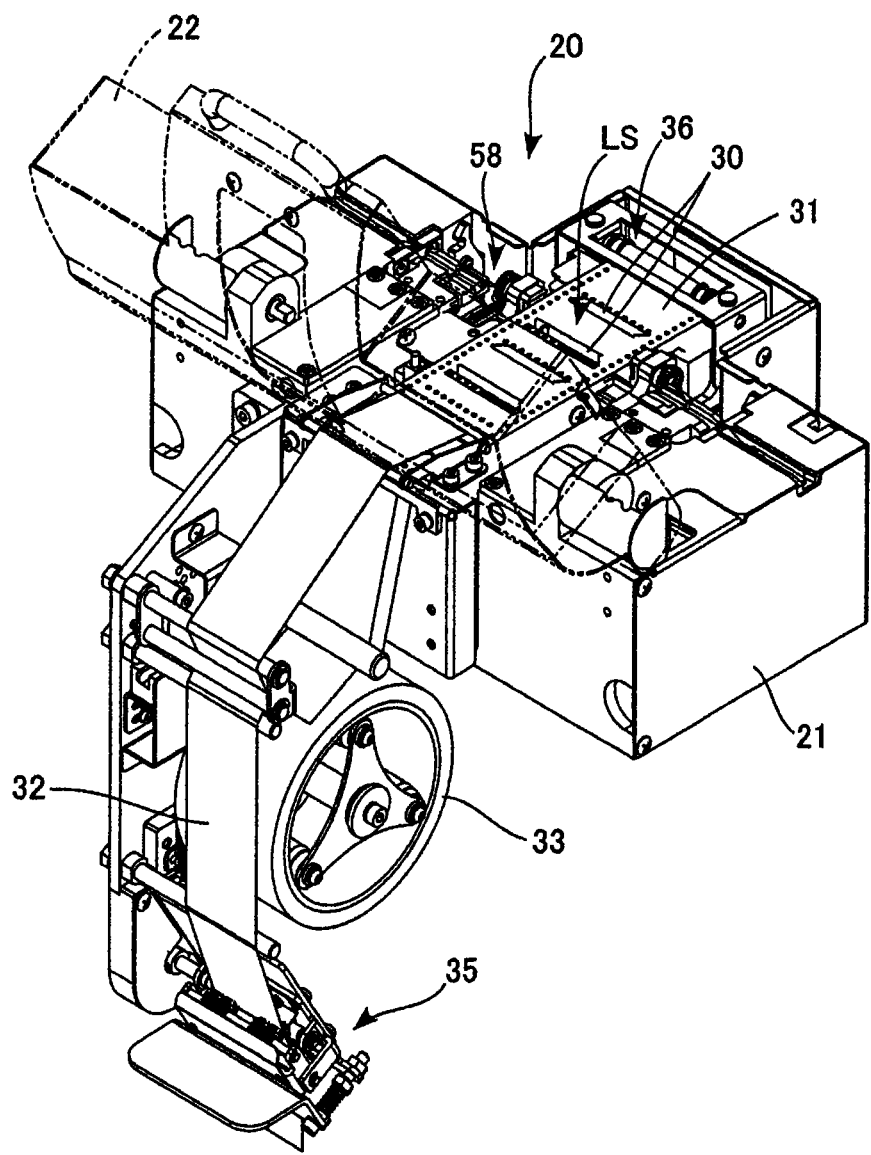
FIG. 6 is a diagram showing the splicing device with the splicing tape loaded.

In splicing device 20, as shown in FIG. 6, rotatable supply reel 33 wound in a roll shape with the three-layer structure which includes splicing tape 30, base paper indexing device 35 for indexing base paper 32 peeled from splicing tape 30, and protective tape indexing device 36 for indexing protective tape 31 peeled from splicing tape 30 are arranged along the line sideways from splicing position LS at which two carrier tapes T1 and T2 are spliced.

For the attachment strength of base paper 32 and protective tape 31 attached to both sides of splicing tape 30, the attachment strength for protective tape 31 is stronger, so that splicing tape 30 is not peeled from protective tape 31 even when base paper 32 is peeled from splicing tape 30.

However, when carrier tapes T1 and T2 are attached to the attachment surface of splicing tape 30 from which base paper 32 has been peeled, that attachment force is stronger than the attachment force for protective tape 31, so that protective tape 31 can be easily peeled from splicing tape 30.

The three-layer structure of base paper 32, splicing tape 30, and protective tape 31 is attached to splicing device 20 in a state wound around supply reel 33, and the leading end thereof is pulled out from supply reel 33. Then, base paper is peeled and folded back by an operator, and base paper 32 is indexed by base paper indexing device 35 and discarded into a base paper collection box which is omitted from the figures.

Figure 10:
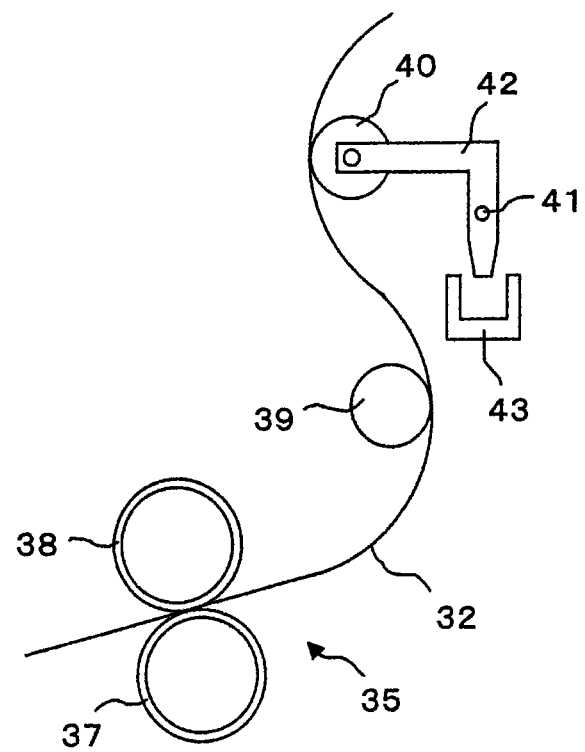
FIG. 10 is a schematic diagram showing the base paper indexing device.

Base paper indexing device 35, as shown in FIG. 10, has driving gear 37 and driven gear 38 each formed with gears in the outer surface. Driven gear 38 is attached such that it can contact and be separated from driving gear 37, and normally the outside of driven gear 38 is pressed against the outside of driving gear 37 by the biasing force of a spring which is omitted from the figures. By this, driven gear 38 is separated from driving gear 37 and base paper 32 is sandwiched between both gears 37 and 38, and in that state, by moving driving gear 37 using a motor omitted from the figures, base paper 32 is indexed by the rotation of both gears 37 and 38.

Upstream of driving gear 37 and driven gear 38, contacting roller 40 which can be contacted by base paper 32 guided by guide roller 39 is provided. Contacting roller 40 is attached to an end of dog 42 which is attached such that it can be pivoted around hinge pin 41, and normally dog 42 is held at a predetermined angle and position at which sensor 43 is on by a spring and stopper omitted from the figures. However, when tension is applied to base paper 32, contacting roller 40 is pressed by the tension so that dog 42 rotates and sensor 43 turns off. By this, a fixed tension can be imparted on base paper 32, and only the required amount of base paper 32 can be peeled from protective tape 31.

Protective tape 31 from which base paper 32 has been peeled, in other words, protective tape 31 (refer to FIG. 30) to which is affixed multiple splicing tapes 30 with their attachment surfaces facing up, is made to come across the center of splicing position LS, such that the leading end thereof is engaged with reel for indexing 46 of protective tape indexing device 36 after passing through joining device 58 which is described below. Protrusions 46a which engage with indexing holes 31a of protective tape 31 are formed at even intervals on the circumference of both edges of reel for indexing 46, and by moving a motor for indexing which is omitted from the figures and which is connected to this reel for indexing 46, protective tape 31 which is engaged by protrusions 46a is indexed and protective tape 31 is discarded into a collection box which is omitted from the figures.

Metal powder is embedded in splicing tape 30 and the embedded metal powder is detected by metal detection sensor 47. Metal detection sensor 47, as shown in FIG. 8, is provided in front of splicing position LS in a position separated from splicing position LS by a fixed distance S1, and when the end of splicing tape 30 is detected by metal detection sensor 47 through detection slit 48, from that detection position, the splicing tape 30 is accurately positioned at splicing position LS by protective tape 31 being indexed exactly a fixed amount S1 by the motor of protective tape indexing device 36.

As shown in FIG. 4, automatic splicing device 20 comprises number one and number two tape indexing devices 50 and 51, number one and number two component detection devices 52 and 53, number one and number two cutting devices 54 and 55, number one and number two takeup devices 56 and 57, joining device 58, and control device 59 (refer to FIG. 1). Number one and number two tape indexing devices 50 and 51, number one and number two cutting devices 54 and 55, number one and number two takeup devices 56 and 57, joining device 58 (excluding some part), and control device 59 are arranged stored inside housing 21 and lid 22.

Figure 13:
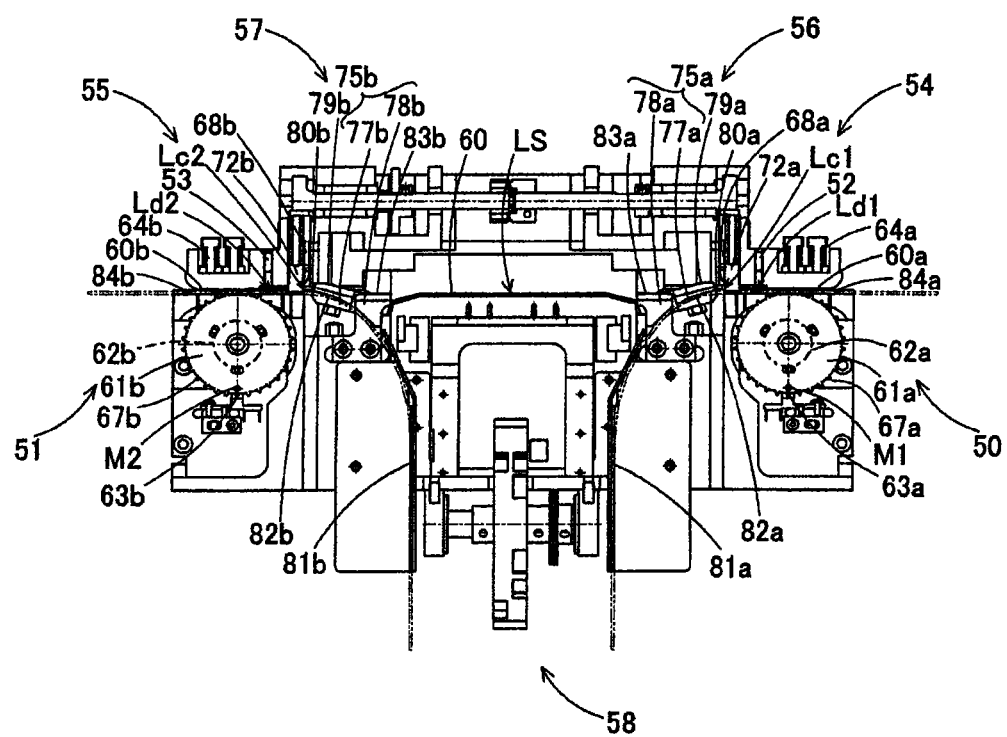
FIG. 13 is a diagram showing the splicing device with the housing and lid removed and the interior exposed.

In other words, as shown in FIG. 13, at each side of housing 21 and lid 22, number one and number two tape indexing devices 50 and 51 are respectively arranged, and number one and number two cutting devices 54 and 55 are respectively arranged between number one and number two tape indexing devices 50 and 51 (hereafter referred to as number one and number two cutting positions Lc1 and Lc2). Further, number one and number two takeup devices 56 and 57 are respectively arranged between number one and number two cutting devices 54 and 55 (between hereafter referred to as number one and number two cutting positions Lc1 and Lc2, and splicing position LS), and joining device 58 is arranged between number one and number two takeup devices 56 and 57. And, number one and number two component detection devices 52 and 53 are arranged above number one and number two detection positions Ld1 and Ld2 of number one and number two conveyance paths 60a and 60b of number one and number two tape indexing devices 50 and 51.

As shown in FIG. 13, number one and number two tape indexing devices 50 and 51 comprise items such as number one and number two conveyance paths 60a and 60b provided extending horizontally towards the center from each side of housing 21, number one and number two sprockets 61a and 61b arranged below number one and number two conveyance paths 60a and 60b, number one and number two gear motors 62a and 62b connected to number one and number two sprockets 61a and 61b, number one and number two sprocket tooth detection devices 63a and 63b arranged adjacent to number one and number two sprockets 61a and 62b, and number one and number two tape detection devices 64a and 64b arranged above number one and number two conveyance paths 60a and 60b. Number one and number two tape indexing devices 50 and 51 are configured such that number one and number two carrier tapes T1 and T2 are conveyed along number one and number two conveyance paths 60a and 60b, so that number one and number two cutting points Q1 and Q2 of number one and number two carrier tapes T1 and T2 can be positioned sequentially at number one and number two cutting positions Lc1 and Lc2 and splicing position LS.

Number one and number two conveyance paths 60a and 60b have a slightly wider width than the width of number one and number two carrier tapes T1 and T2, and are formed in a groove in a straight line extending from number one and number two tape inlets 84a and 84b provided in each side of housing 21 to number one and number two cutting positions Lc1 and Lc2 of number one and number two carrier tapes T1 and T2 according to number one and number two cutters 68a and 68b of number one and number two cutting devices 54 and 55 which are described below. Further, as shown in enlarged figure A of FIG. 5 (showing only number two conveyance path 60b, with conveyance path 60a being the same), number one and number two narrow grooves 65a and 65b are provided in number one and number two conveyance paths 60a and 60b such that number one and number two cavities Cte1 and Cte2 of number one and number two embossed tapes T1e and T2e stored in which are stored number one and number two components e1 and e2 can pass through.

In other words, number one and number two plate springs 66a and 66b are fixedly arranged at number one and number two cutting positions Lc1 and Lc2 in number one and number two narrow grooves 65a and 65b. Number one and number two plate springs 66a and 66b are bent in a concave shape and fixedly arranged to be inclined such that they are sloping towards and diagonally above number one and number two cutting positions Lc1 and Lc2. Number one and number two plate springs 66a and 66b are members which are effective when cutting and conveying number one and number two embossed tape T1e and T2e, with details described below.

Multiple number one and number two teeth 67a and 67b are formed in a circumferential direction in number one and number two sprockets 61a and 61b at the same pitch Ph as number one and number two indexing holes Hc1 and Hc2 which are formed in number one and number two carrier tapes T1 and T2. Number one and number two sprockets 61a and 61b are arranged below number one and number two conveyance paths 60a and 60b such that number one and number two teeth 67a and 67b which have been rotated to the highest point among number one and number two teeth 67a and 67b being rotated, and number one and number two indexing holes Hc1 and Hc2 of number one and number two carrier tapes T1 and T2 which enter along number one and number two conveyance paths 60a and 60b, can engage with each other.

Number one and number two gear motors 62a and 62b are, for example, stepping motors for which position control of number one and number two cutting points Q1 and Q2 of number one and number two carrier tapes T1 and T2 conveyed by connected number one and number two sprockets 61a and 61b is possible.

Number one and number two sprocket tooth detection devices 63a and 63b are, for example, photosensors which detect whether one of number one and number two teeth 67a and 67b of number one and number two sprockets 61a and 61b have become vertical, in other words whether number one and number two sprockets 61a and 61b have reached the origin position, by reading number one and number two marks M1 and M2 affixed to the side of number one and number two sprockets 61a and 61b.

Number one and number two tape detection devices 64a and 64b are, for example, touch sensors which detect whether number one and number two carrier tapes T1 and T2 have been inserted into number one and number two tape inlets 84a and 84b provided in each side of housing 21 by contacting number one and number two carrier tapes T1 and T2. Here, it is also acceptable to use a photosensor instead of a touch sensor.

Number one and number two component detection devices 52 and 53 are, for example, photosensors which detect: the tape section between number one and number two cavities Ct1 and Ct2, number one and number two cavities Ct1 and Ct2 of number one and number two carrier tapes T1 and T2 conveyed along number one and number two conveyance paths 60a and 60b; and number one and number two components e1 and e2 in number one and number two cavities Ct1 and Ct2, by the change in the amount of light. Here, it is also acceptable to use a camera instead of a photosensor.

Figure 14:
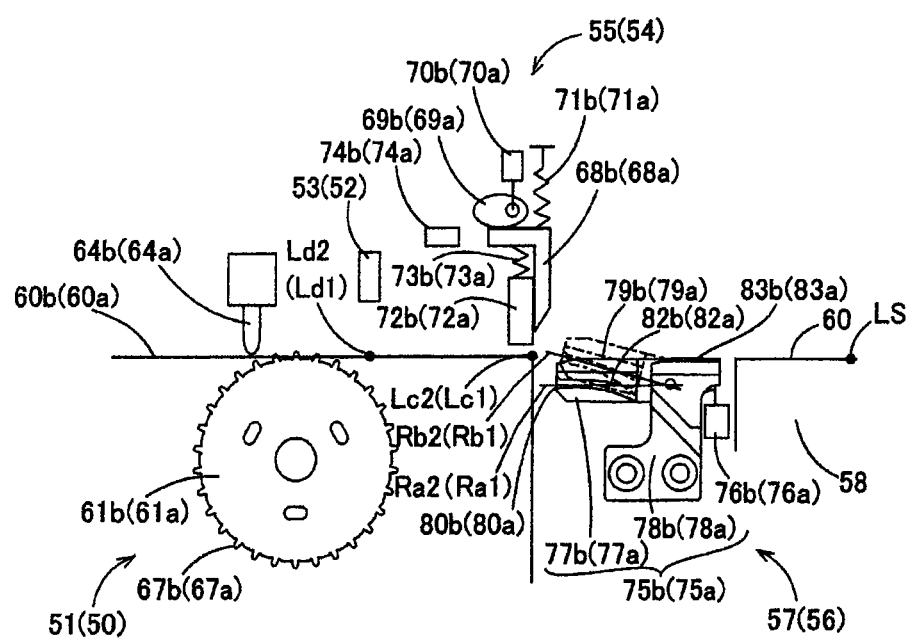
FIG. 14 is a diagram showing a schematic outline of the splicing device.

As shown in FIG. 13 and FIG. 14, number one and number two cutting devices 54 and 55 comprise items such as number one and number two cutters 68a and 68b provided at number one and number two cutting positions Lc1 and Lc2, number one and number two cams 69a and 69b which can slidably contact number one and number two cutters 68a and 68b, number one and number two gear motors 70a and 70b connected to number one and number two cams 68a and 68b, number one and number two cutters springs 71a and 71b one end of which is attached to number one and number two cutters 68a and 68b and the other end of which is attached to the inside of lid 22, number one and number two pressing members 72a and 72b provided to be contacting number one and number two cutters 68a and 68b, number one and number two pressing springs 73a and 73b one end of which is attached to number one and number two cutters 68a and 68b and the other end of which is attached to number one and number two pressing members 72a and 72b, and number one and number two cutter detection devices 74a and 74b arranged adjacent to number one and number two cutters 68a and 68b. Number one and number two tape cutting devices 54 and 55 are capable of cutting number one and number two unnecessary sections Tf1 and Tf2 at number one and number two cutting points Q1 and Q2 of number one and number two carrier tapes T1 and T2.

Number one and number two cutters 68a and 68b are single blade cutters with a width which is wider than number one and number two carrier tapes T1 and T2. Number one and number two cutters 68a and 68b are attached to be movable up and down in order to cut number one and number two cutting points Q1 and Q2 of number one and number two carrier tapes T1 and T2 positioned at number one and number two cutting positions Lc1 and Lc2.

Number one and number two cams 69a and 69b are arranged rotatably connected to number one and number two gear motors 70a and 70b and are positive motion cams which slidably connect to number one and number two cutters 68a and 68b to move number one and number two cutters 68a and 68b up and down.

Number one and number two cutter springs 71a and 71b are extension springs which bias number one and number two cutters 68a and 68b up so that number one and number two cutters 68a and 68b return to the holding position after cutting is completed.

Number one and number two pressing members 72a and 72b are plate members with a width slightly wider than the width of number one and number two carrier tapes T1 and T2. Number one and number two pressing members 72a and 72b are provided to be movable up and down in order to press and fix the area around number one and number two cutting points Q1 and Q2 of number one and number two carrier tapes T1 and T2 positioned at number one and number two cutting positions Lc1 and Lc2.

Number one and number two pressing springs 73a and 73b are compression springs to bias number one and number two pressing members 72a and 72b downwards with the lowering of number one and number two cutters 68a and 68b, and are springs for pressing the area around number one and number two cutting points Q1 and Q2 of number one and number two carrier tapes T1 and T2.

Number one and number two cutter detection devices 74a and 74b are, for example, photosensors which detect whether number one and number two cutters 68a and 68b are positioned in the cutting holding position. Here, it is also acceptable to use a touch sensor instead of a photosensor.

As shown in FIG. 13 and FIG. 14, number one and number two takeup devices 56 and 57 are provided between splicing position LS and number one and number two cutting positions Lc1 and Lc2, and are comprised of items such as number one and number two takeup members 75a and 75b which are made from number one and number two movable members 77a and 77b and number one and number two fixed members 78a and 78b, and number one and number two takeup member moving devices 76a and 76b which move number one and number two movable members 77a and 77b. Number one and number two tape takeup devices 56 and 57 are configured to be capable of respectively taking up number one and number two unnecessary sections Tf1 and Tf2 cut from number one and number two carrier tapes T1 and T2.

Number one and number two movable members 77a and 77b are rotatably attached to number one and number two fixed members 78a and 78b. Number one and number two movable conveyance paths 79a and 79b which make up part of number one and number two conveyance paths 60a and 60b, and number one and number two apertures 80a and 80b for taking up number one and number two unnecessary sections Tf1 and Tf2 of number one and number two carrier tapes T1 and T2 conveyed on number one and number two conveyance paths 60a and 60b are formed in number one and number two movable members 77a and 77b. Also provided in number one and number two movable members 77a and 77b are number one and number two ducts 82a and 82b which guide taken up number one and number two unnecessary sections Tf1 and Tf2 into number one and number two disposal points 81a and 81b which are below number one and number two conveyance paths 60a and 60b. Further, number one and number two movable conveyance paths 79a and 79b, and number one and number two fixed conveyance paths 83a and 83b which make up part of number one and number two conveyance paths 60a and 60b and which are capable of forming a line, are formed in number one and number two fixed members 78a and 78b. Here, it is acceptable for number one and number two movable members 77a and 77b to be attached to number one and number two fixed members 78a and 78b to be movable up and down.

Number one and number two takeup member moving devices 76a and 76b are, for example, solenoids and are connected to number one and number two movable members 77a and 77b such that number one and number two movable members 77a and 77b can be moved between: number one and number two conveyance positions Ra1 and Ra2 at which number one and number two movable conveyance paths 79a and 79b are arranged in a line with number one and number two conveyance paths 60a and 60b; and number one and number two aperture forming positions Rb1 and Rb2 which are where apertures 80a and 80b are formed in number one and number two conveyance paths 60a and 60b between splicing position Ls and number one and number two cutting positions Lc1 and Lc2.

Joining device 58 is provided between number one cutting device 54 and number two cutting device 55 and formed therein is conveyance path 60 which is part of number one and number two conveyance paths 60a and 60b. Joining device 58 is capable of conveying along conveyance path 60 and connecting number one and number two carrier tapes T1 and T2 of which number one and number two cutting points Q1 and Q2 are aligned at splicing position LS in the center of conveyance path 60 using splicing tape 30.

Next, the configuration of joining device 58 is described based on FIG. 25 to FIG. 29. Joining device 58 has items such as number one raising/lowering platform 91, retainer plate 97, number two raising/lowering platform 101, and rotating platform 103. Legs 92 of number one raising/lowering platform 91 are guided and supported on housing 21 capable of being raised/lowered. Two each of number one positioning pins 93 and 94 capable of engaging with each indexing hole Hc of two carrier tapes T1 and T2 and positioning holes 30a1 formed in splicing tape 30a are formed along the indexing direction of carrier tapes T1 and T2 on both sides of number one raising/lowering platform 91 with the engagement position (alignment position) of the two carrier tapes T1 and T2 at the center. Each pitch of these two sets of number one positioning pins 93 and 94 is fixed as twice pitch P of indexing holes Hc on carrier tapes T1 and T2.

Also, pin holes 95 are formed on raising/lowering platform 91 between each number one positioning pins 93 and 94, and number two positioning pins 105 on rotating platform 103 described below are capable of being inserted into these pin holes 95.

Also, moving platform 96 is guided and supported capable of being moved on housing 21 is a horizontal direction perpendicular to the lengthwise direction of carrier tapes T1 and T2, and retainer plate 97 is attached to this moving platform 96 above number one positioning pins 93 and 94. U-shaped grooves 98 which can house number one positioning pins 93 and 94 are formed in an end of retainer plate 97, and retainer plate 97 can be advanced and retracted between a retract point in which grooves 98 are separated from number one positioning pins 93 and 94, and an advance point at which grooves 98 house number one positioning pins 93 and 94.

Further, legs 102 of number two raising/lowering platform 101 are guided and supported on housing 21 capable of being raised/lowered. Rotating platform 103 is attached at both ends on number two raising/lowering platform 101 capable of being rotated 180 degrees with pivot axis 104 which is parallel to the lengthwise direction of carrier tapes T1 and T2 as the rotational center. Pressing plate 103a is provided on rotating platform 103 in a position offset from the rotational center, and multiple number two positioning pins 105 and pin holes 106 are provided in this pressing plate 103a. Number two positioning pins 105 are arranged in positions corresponding to each space between number one positioning pins 93 and 94 provided on number one raising/lowering platform 91 described above, such that they are capable of being inserted into pin holes 95 provided in number one raising/lowering platform 91. Also, pin holes 106 are arranged in positions corresponding to each space between number two positioning pins 105, such that number one positioning pins 93 and 94 provided in number one raising/lowering platform 91 are capable of being inserted into them.

By the 180 degree rotation of rotating platform 103, number two positioning pins 105 engage with positioning holes 30a1 of splicing tape 30a and indexing holes Hc of the two carrier tapes T1 and T2 positioned at splicing position LS, such that a fixed three-way positional relationship is maintained between the two carrier tapes T1 and T2 and splicing tape 30 used to connect those.

Pinion 107 is attached to pivot axis 104 of rotating platform 103, and rack 108 which engages with this pinion 107 is attached to movable platform 109 capable of being moved in a horizontal direction perpendicular to the conveyance direction of carrier tapes T1 and T2. By this, when moving platform 109 is moved, by the rack and pinion mechanism formed from pinion 107 and rack 108, rotating platform 103 is rotated.

Cam drum 110 is attached to housing 21 capable of being rotated around an axis line parallel to the rotational center of rotating platform 103, such that it is rotated slowly in a fixed direction by a moving motor which is omitted from the figures. Two each on the inside and outside cam grooves 110a, 110b, 110c, and 110d are formed with a no-edge form in the circumferential direction of each on both surfaces of cam drum 110.

Number one follower roller omitted from the figures attached to leg 92 of number one raising/lowering platform 91 is engaged with number one cam groove 110a. Number two follower roller omitted from the figures attached to moving platform 96 connected to retainer plate 97 is engaged with number two cam groove 110b. Number three follower roller omitted from the figures attached to leg 102 of number one raising/lowering platform 101 is engaged with number three cam groove 110c. Number four follower roller omitted from the figures attached to connecting member 112 connected to moving platform 109 is engaged with number four cam groove 110d.

By this, when cam drum 110 is rotated, respective raising/lowering operation of number one and number two raising/lowering platforms 91 and 101, advancing/retracting operation of retainer plate 97, and rotating operation of rotating platform 103 are performed in series via number one to number four follower rollers respectively engaging with number one to number four cam grooves 110a to 110d, such that number one and number two raising/lowering platforms 91 and 101, retainer plate 97, and rotating platform 103 return to their origin positions with one rotation of cam drum 110.

Next, the splicing operation of the above embodiment is described. When the remaining quantity of components e held in number one carrier tape T1 wound around reel 12 attached to tape feeder 10 becomes few, splicing processing to connect the leading end of number two carrier tape T2 wound around another reel in which is stored the same type of component e with the tail end of carrier tape T1 using splicing tape 30 is performed. The component is replenished by this splicing such that component supply from tape feeder 10 can be continued.

For this splicing, normally a check as to whether carrier tape in which the correct component is stored has been connected, what is known as splicing verification, is performed. With splicing verification, the barcode affixed to the old reel is read with a barcode reader and the serial ID of the component stored in the old reel is transmitted to the management computer. Next, the barcode affixed to the new reel is read by a barcode reader and the serial ID of the component stored in the new reel is transmitted to the management computer.

Data related to components is saved in the database of the management computer by each serial ID, so a check can be performed from the read serial IDs as to whether the components stored in the two carrier tapes T1 and T2 are the same type. If the components are different, the operator is notified by a verification error being displayed on the operation panel and the operator performs splicing again based on this.

When this kind of splicing verification is completed, each end of the two carrier tapes T1 and T2 is cut using scissors. Here, normally provided in the end of each carrier tape T1 and T2 is a section of several cm of empty cavities in which components are not stored, and this section is cut by the operator. In this case, the cut surfaces, as described clearly hereafter, are not the surfaces of the two carrier tapes T1 and T2 to be aligned, they are surfaces to be cut again, therefore it is not required for them to be especially accurate.

Figure 15:
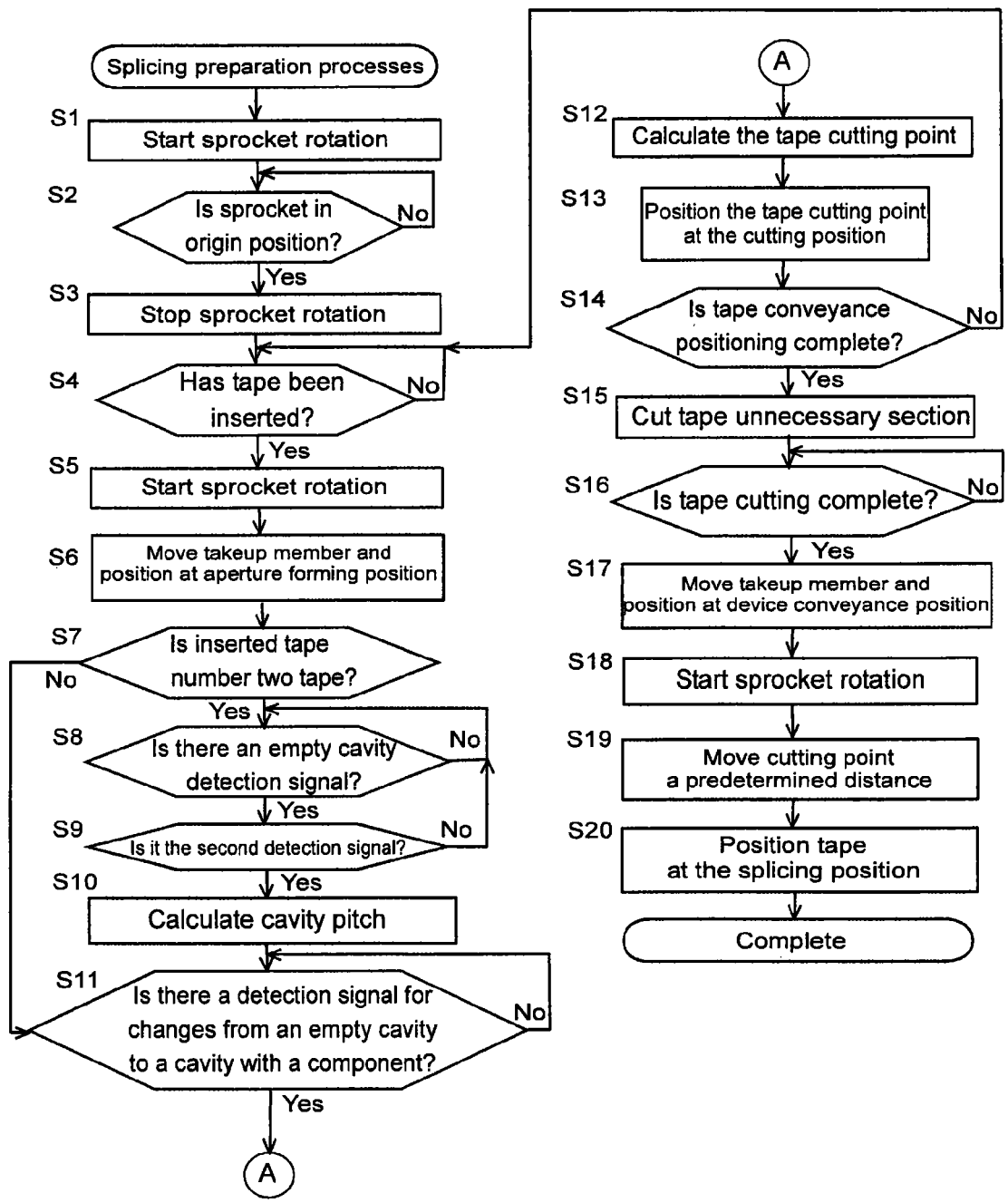
FIG. 15 is a flow chart to illustrate the splicing preparation processes of the splicing device.

First, among the operations of automatic splicing device 20, splicing preparation processes are described with reference to the flowchart in FIG. 15. In the following description, descriptions are given for when the operator has set number one carrier tape T1 (the type shown in FIG. 11 [FIG. 12 (A)]) into automatic splicing device 20 after setting number two carrier tape T2 (the type shown in FIG. 11 [FIG. 12 (A)]), however, the same applies when number two carrier tape T2 is set after setting number one carrier tape T1.

By the power to splicing device 20 being turned on by the operator, control device 59 starts rotating number one and number two sprockets 61a and 61b (step S1), and judges as to whether a detection signal is received from number one and number two sprocket tooth detection devices 63a and 63b, in other words whether number one and number two sprockets 61a and 61b are at the origin position (step S2). Next, if a detection signal is received from number one and number two sprocket tooth detection devices 63a and 63b, rotation of number one and number two sprockets 61a and 61b is stopped (step S3).

Figure 16:
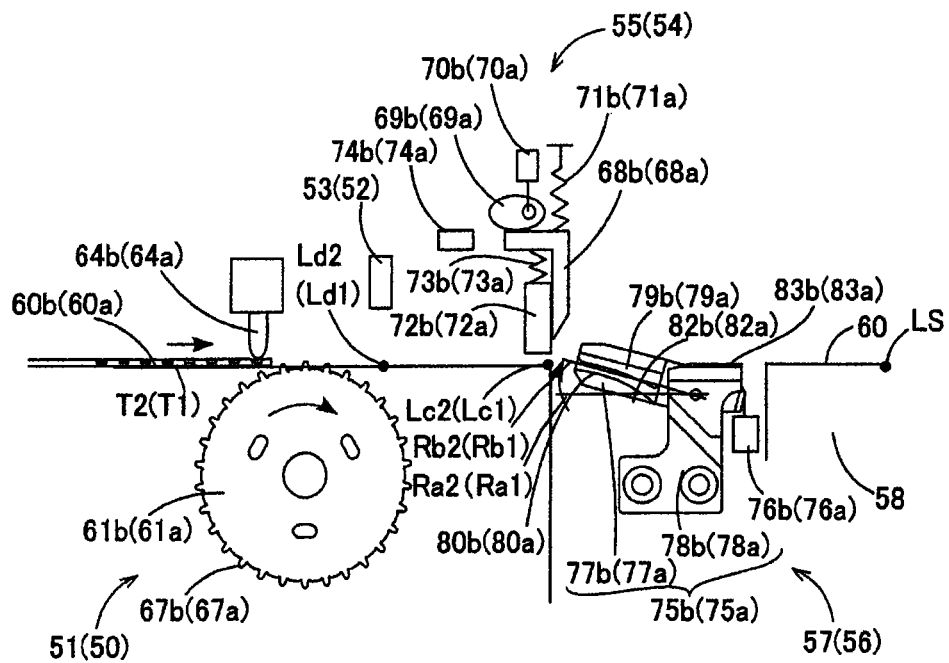
FIG. 16 is a schematic diagram showing the carrier tape insertion process of the splicing preparation processes.

Control device 59 judges whether a detection signal has been received from number two tape detection device 64b, in other words, as to whether the leading end of number two tape T2 has been inserted into number two conveyance path 60b from number two tape inlet 84b (step S4). Then, if a detection signal is received from number two tape detection device 64b, as shown in FIG. 16, rotation of number two sprocket 61b is started (step S5), and number two movable member 77b of number two takeup member 75b is moved up and positioned (step S6) at number two aperture forming position Rb2.

Figure 17:
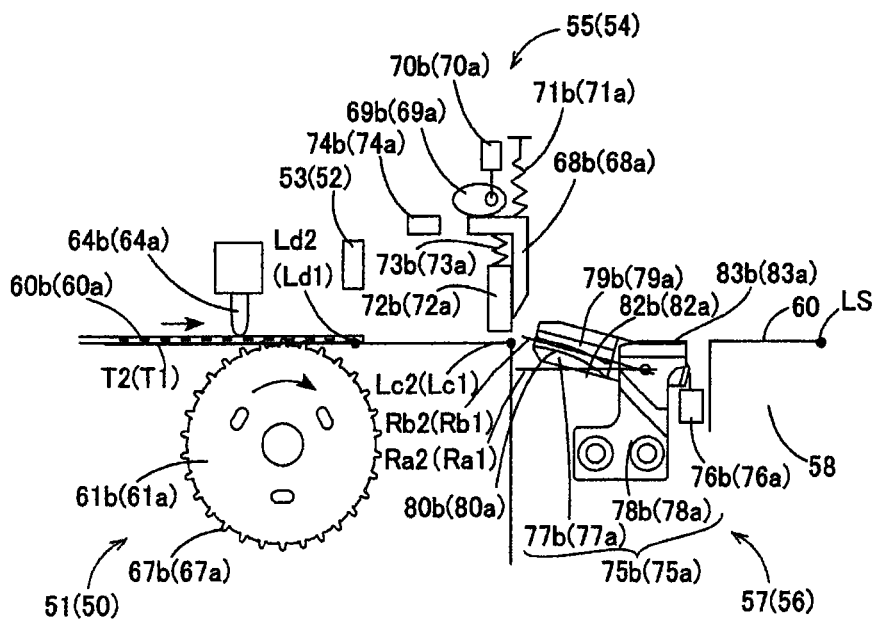
FIG. 17 is a diagram showing the carrier tape cavity detection process of the splicing preparation processes.

Control device 59 judges (step S7) whether the inserted tape is number two carrier tape T2, and in this case a detection signal has been received from number two detection device 64b, so it judges that the inserted tape is number two carrier tape T2 and then judges (step S8) whether a detection signal for an empty number two cavity Ct2 without a number two component e2 in number two carrier tape T2 is received from number two component detection device 53. Then, as shown in FIG. 17, if an empty number two cavity Ct2 is detected, a judgment (step S9) is performed as to whether that detection is the second detection, and if it is not the second detection, the process returns to step S8 and a judgment is performed as to whether the next empty number two cavity Ct2 has been detected.

Control device 59, in step S9, in the case that the detection of the empty number two cavity Ct2 is the second detection, calculates fixed pitch Pc between number two cavities Ct2 based on the detected first and second number two cavities Ct2. Then, a judgment (step S11) is performed as to whether a detection signal detecting the change from an empty number two cavity Ct2 to a number two cavity Ct2 with a number two component e2 is received from number two component detection device 53.

Figure 18:
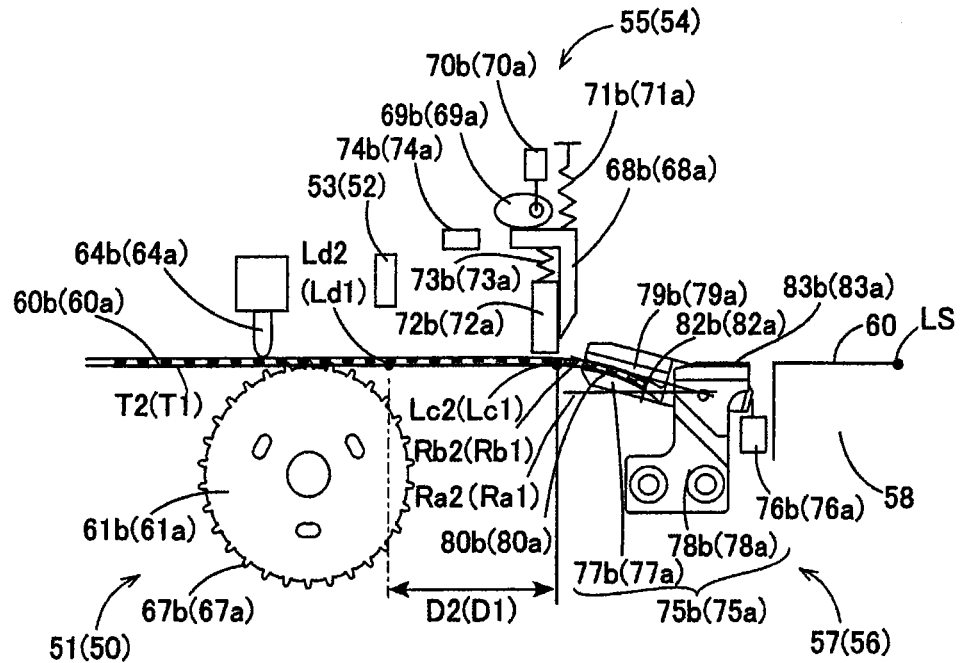
FIG. 18 is a diagram showing the process for positioning the cutting point of the carrier tape of the splicing preparation processes.

Control device 59, if it detects a change to a number two cavity Ct2 with a number two component e2, calculates number two cutting point Q2 of number two tape T2 from the number two distance D2 between the already known number two detection position Ld2 and number two cutting position Lc2, and fixed pitch Pc between number two cavities Ct2 calculated in step S10. Then, as shown in FIG. 18, number two tape T2 is moved number two distance D2, number two unnecessary section Tf2 is taken up inside number two takeup member 75b from number two aperture 80b, and the conveyance position of number two cutting point Q2 is decided at number two cutting position Lc2.

Figure 19:
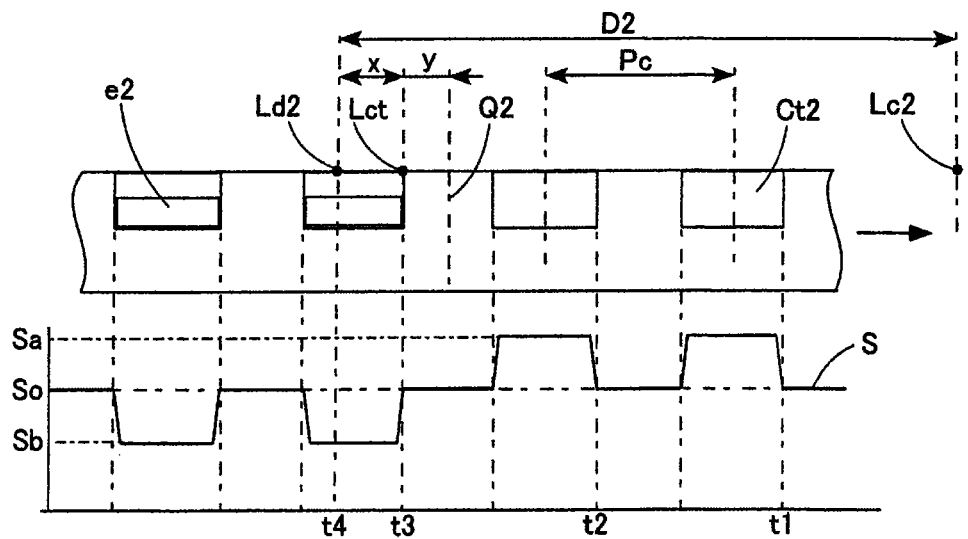
FIG. 19 is a diagram to illustrate the calculation process for the cutting point and cavity pitch of the carrier tape of the splicing preparation processes.

Next, an example of processing from the above step S8 to step S13 is described in detail. As shown in FIG. 19, for detection signal (light amount) S from number two component detection device 53, if So is taken to indicate the tape section between number two cavities Ct2 of number two tape T2, Sa is indicated for empty number two cavities Ct2 without a number two component e2 because the amount of light passing through increases, and Sb is indicated for number two cavities Ct2 with a number two component e2 because the amount of light passing through decreases.

Here, point in time t1 at which detection signal S arises when there is a change from the tape section to the first empty number two cavity Ct2, and point in time t2 at which detection signal S arises when there is a change from the tape section to the second empty number two cavity Ct2 are detected, and the pulse quantity of number two gear motor 62b for number two sprocket 61b is counted between point in time t1 and point in time t2. Then, by calculating a number two tape T2 indexing amount based on this pulse count, fixed pitch Pc between number two cavities Ct2 can be calculated.

Next, when there is a change from empty number two cavity Ct2 to number two cavity Ct2 with a number two component e2, the pulse quantity of number two gear motor 62b for number two sprocket 61b is counted between current point in time t4 and point in time t3 at which detection signal S from that time arose. Then, by calculating a number two tape T2 indexing amount based on this pulse count, the distance x between number two detection position Ld2 and right edge position Lct as shown in the figure of number two cavity Ct2 with a number two component e2 can be calculated. Also, from fixed pitch Pc between number two cavities Ct2, the center position of the tape section between number two cavities Ct2 and right edge position Lct as shown in the figure of number two cavity Ct2 with a number two component e2, in other words distance y to number two cutting point Q2, can be calculated.

Then, by conveying number two tape T2 just the distance D2−x−y calculated by subtracting the above distances x and y from number two distance D2 between already known number two detection position Ld2 and number two cutting position Lc2, the conveyance position of number two cutting point Q2 can be decided at number two cutting position Lc2. Alternatively, by conveying number two tape T2 just number two distance D2 after reverse conveying number two tape T2 just the above distances x and y, the conveyance position of number two cutting point Q2 can be decided at number two cutting position Lc2.

Described above was the situation for the type of tape shown in FIG. 11 (FIG. 12 [A]) as number two carrier tape T2, but for the types of tapes shown in FIGS. 12 (B) and (C), number one and number two cutting points Q1 and Q2 must be calculated so that the pitch after splicing between number one indexing holes Hc1 of number one carrier tape T1 and number two indexing holes Hc2 of number two carrier tape T2 becomes fixed pitch Ph. In this case, the deviation amount from the origin position of number one and number two sprockets 61a and 61b when changing from empty number one and number two cavities Ct1 and Ct2 to number one and number two cavities Ct1 and Ct2 with number one and number two components e1 and e2, is calculated from the count of the pulse quantity of number two gear motor 62b and reading of number one and number two marks M1 and M2 by number one and number two sprocket tooth detection devices 63a and 63b. Then, based on this deviation amount and the already known distance between number two detection position Ld2 and the origin position of number one and number two sprockets 61a and 61b, number one and number two cutting points Q1 and Q2 are calculated so that the pitch after splicing between number one indexing holes Hc1 of number one carrier tape T1 and number two indexing holes Hc2 of number two carrier tape T2 becomes fixed pitch Ph.

Control device 59 judges whether deciding the conveyance positions of number two carrier tape T2 and number one carrier tape T1 has been completed (step S14), and in this case, because only deciding the conveyance position of number two carrier tape T2 has been completed, processing returns to step S4 and it judges whether a detection signal has been received from number one tape detection device 64a, in other words, as to whether the tail end of number one tape T1 has been inserted into number one conveyance path 60a from number one tape inlet 84a. Then, if a detection signal is received from number one tape detection device 64a, rotation of number one sprocket 61a is started (step S5), and number one moving member 77a of number one takeup member 75a is moved up and positioned (step S6) at number one aperture forming position Rb1.

Control device 59 judges (step S7) whether the inserted tape is number two carrier tape T2, and in this case a detection signal has been received from number one detection device 64a, so it judges that the inserted tape is number one carrier tape T1, and because fixed pitch Pc between number one cavities Ct1 is the same as the already calculated fixed pitch Pc between number two cavities Ct2, it judges (step S11) whether a detection signal detecting the change from an empty number one cavity Ct1 to a number one cavity Ct1 with a number one component e1 is received from number one component detection device 52.

Control device 59, if it detects a change to a number one cavity Ct1 with a number one component e, calculates number one cutting point Q1 of number one carrier tape T1 from the number one distance D1 between the already known number one detection position Lc1 and number one cutting position Ld1, and fixed pitch Pc between number one cavities Ct1. Then, number one carrier tape T1 is moved number one distance D1, number one unnecessary section Tf1 is taken up inside number one takeup member 75a from number one aperture 80a, and the conveyance position of number one cutting point Q1 is decided at number one cutting position Lc1.

Figure 20:
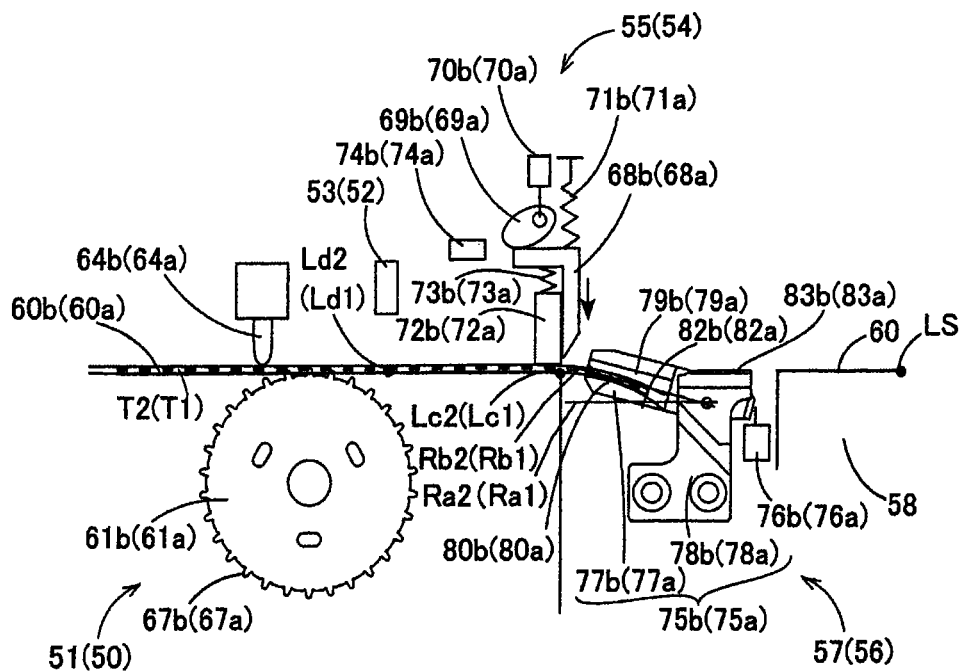
FIG. 20 is a diagram showing the pressing process around the cutting point of the carrier tape of the splicing preparation processes.
Figure 21:
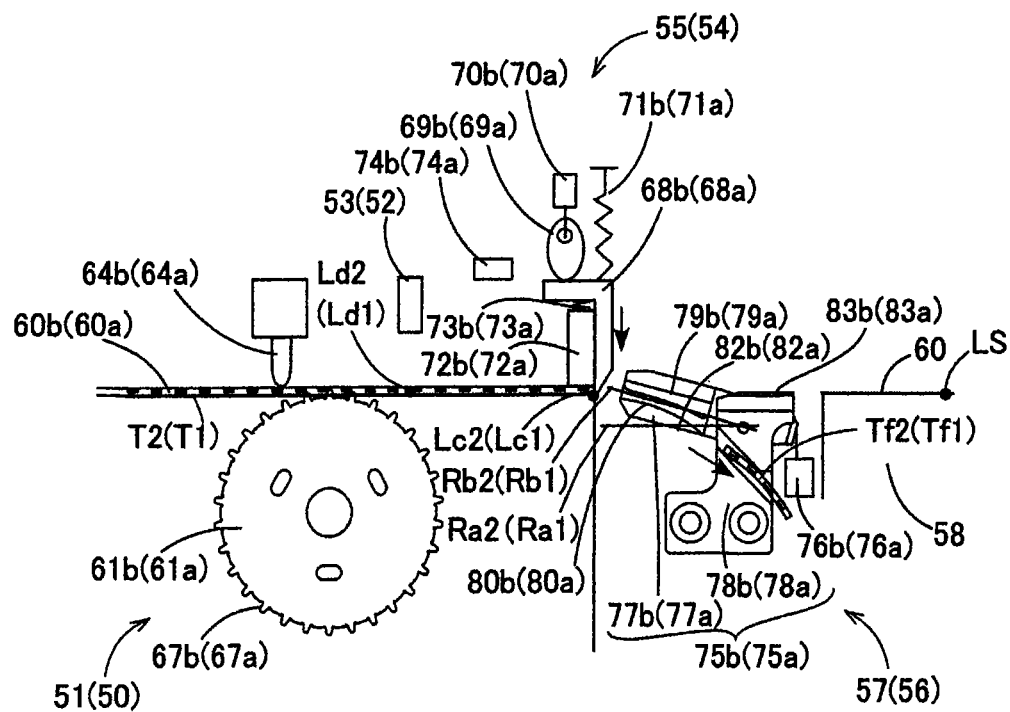
FIG. 21 is a diagram showing the cutting process at the cutting point of the carrier tape of the splicing preparation processes.

Control device 59 judges whether deciding the conveyance positions of number two carrier tape T2 and number one carrier tape T1 has been completed (step S14), and in this case, because deciding the conveyance position of number two carrier tape T2 and number one carrier tape T1 has been completed, as shown in FIG. 20, number one and number two cutters 68a and 68b are respectively lowered along with number one and number two pressing members 72a and 72b, and the area around number one and number two cutting points Q1 and Q2 of number one and number two carrier tapes T1 and T2 positioned at number one and number two cutting positions Lc1 and Lc2 is pressed and fixed using number one and number two pressing members 72a and 72b. Then, as shown in FIG. 21, number one and number two cutters 68a and 68b are respectively lowered further and number one and number two cutting points Q1 and Q2 of number one and number two carrier tapes T1 and T2 are cut (step S15). Cut number one and number two unnecessary sections Tf1 and Tf2 of number one and number two carrier tapes T1 and T2 are guided by number one and number two ducts 82a 82b and discarded into number one and number two disposal points 81a and 81b.

Figure 22:
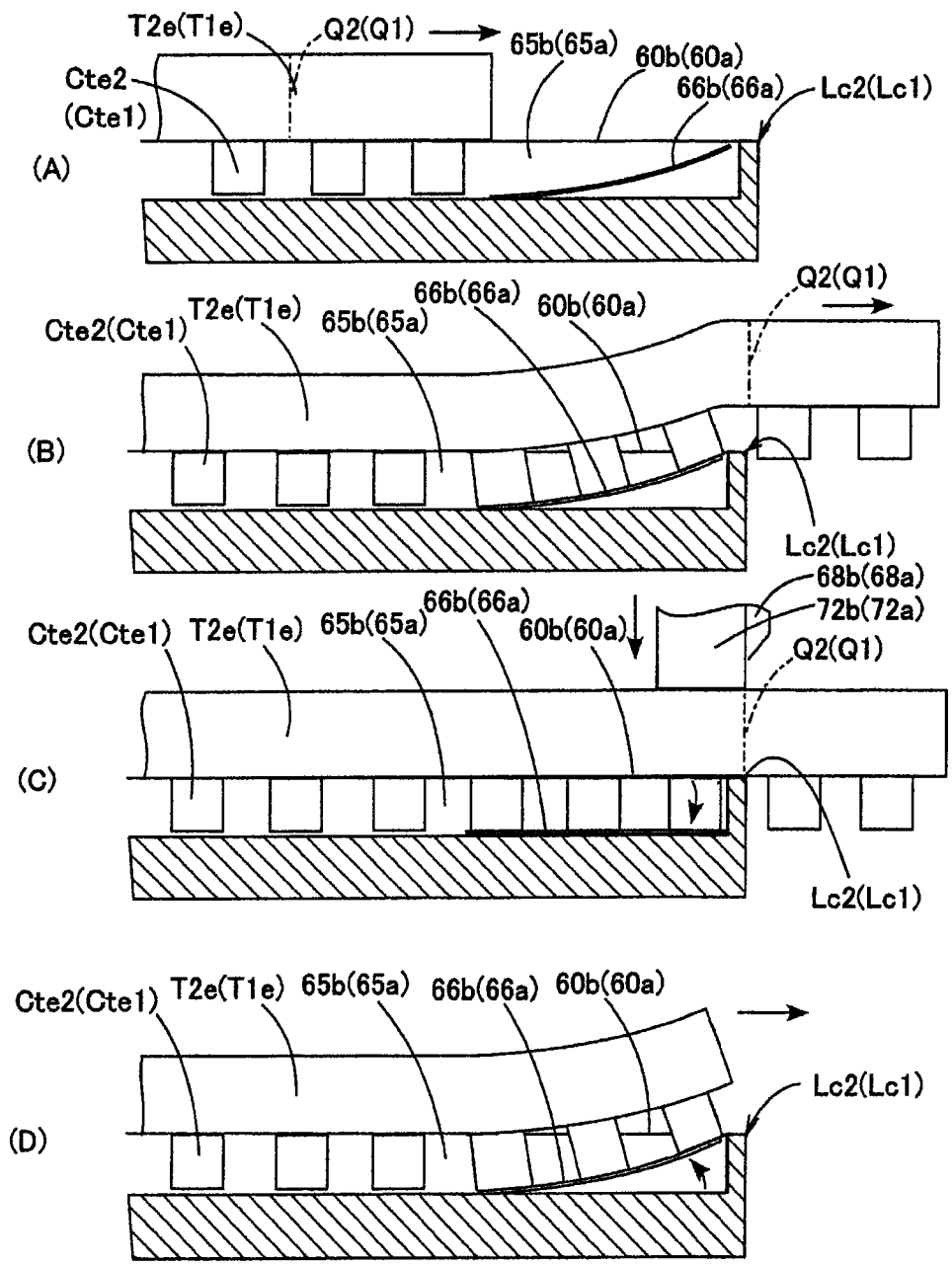
FIG. 22 is a diagram showing the cutting process of embossed carrier tape of the splicing preparation processes.

Described above was the situation for the type of tape shown in FIG. 11 (FIG. 12 [A]) as number one and number two carrier tapes T1 and T2, so described below is the operation when cutting number one and number two embossed tapes T1e and T2e shown in FIG. (D). As shown in FIG. 22, when number one and number two embossed tapes T1e and T2e are conveyed along number one and number two conveyance paths 60a and 60b, number one and number two cavities Cte1 and Cte2 are conveyed inside number one and number two narrow grooves 65a and 65b (refer to FIG. 22 [A]). Then, when number one and number two embossed tapes T1e and T2e get close to number one and number two cutting positions Lc1 and Lc2, number one and number two cavities Cte1 and Cte2 ride on number one and number two plate springs 66a and 66b, go past number one and number two cutting positions Lc1 and Lc2, and number one and number two cutting points Q1 and Q2 are positioned at number one and number two cutting positions Lc1 and Lc2 (refer to FIG. 22 [B]).

Then, when number one and number two cutters 68a and 68b are respectively lowered along with number one and number two pressing members 72a and 72b, number one and number two pressing members 72a and 72b press and fix the area around number one and number two cutting points Q1 and Q2 of number one and number two embossed tapes T1e and T2e positioned at number one and number two cutting positions Lc1 and Lc2. At this time, number one and number two cavities Cte1 and Cte2 are elastically deformed under number one and number two plate springs 66a and 66b and stored in number one and number two narrow grooves 65a and 65b (refer to FIG. 22 [C]). By this, because number one and number two cutting points Q1 and Q2 of number one and number two embossed tapes T1e and T2e are positioned with high accuracy at number one and number two cutting positions Lc1 and Lc2, the cutting accuracy of number one and number two embossed tapes T1e and T2e can be improved.

Then, when number one and number two cutters 68a and 68b are respectively raised along with number one and number two pressing members 72a and 72b, number one and number two plate springs 66a and 66b return to their original position and number one and number two cavities Cte1 and Cte2 around number one and number two cutting positions Lc1 and Lc2 are raised above number one and number two narrow grooves 65a and 65b (refer to FIG. 22 [D]). By this, number one and number two cavities Cte1 and Cte2 can ride on number one and number two plate springs 66a and 66b to go past number one and number two cutting positions Lc1 and Lc2, so conveyance of number one and number two embossed tapes T1e and T2e can be performed smoothly.

Figure 23:
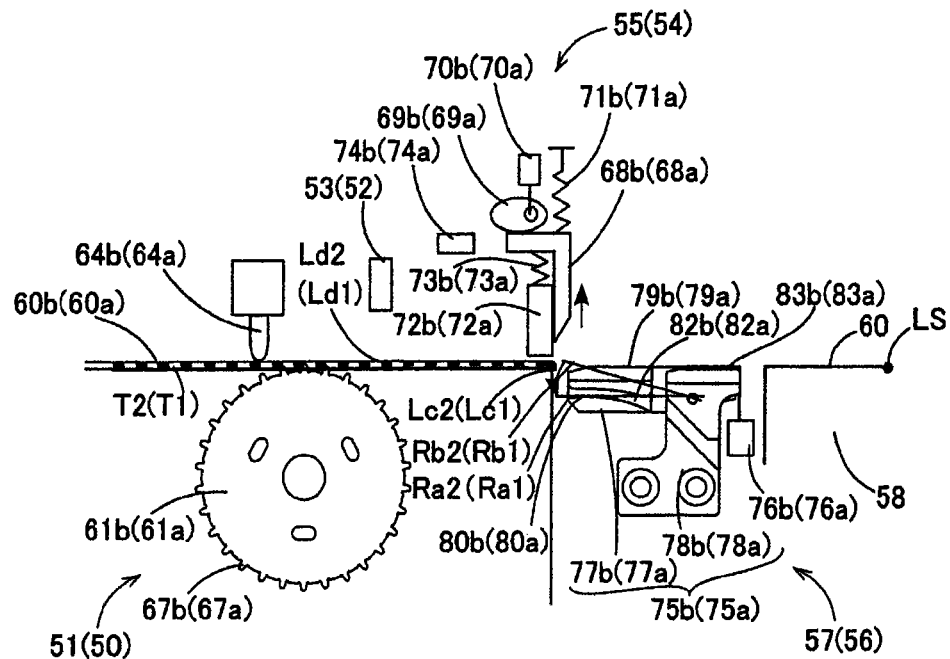
FIG. 23 is a diagram showing the completed state of cutting at the cutting point of the carrier tape of the splicing preparation processes.
Figure 24:
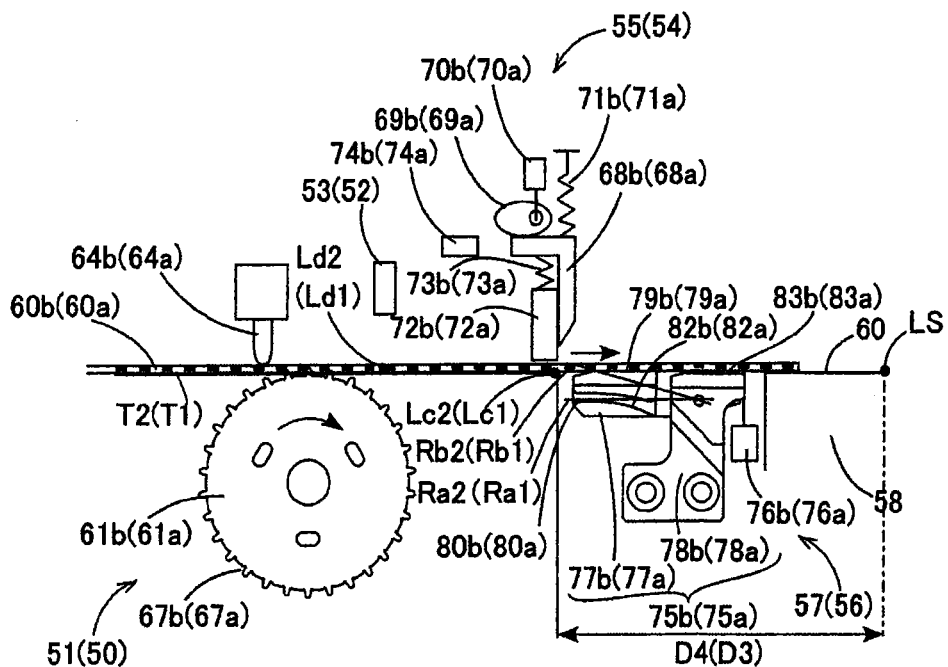
FIG. 24 is a diagram showing the process for positioning the carrier tape at the splicing position of the splicing preparation processes.
Figure 25:
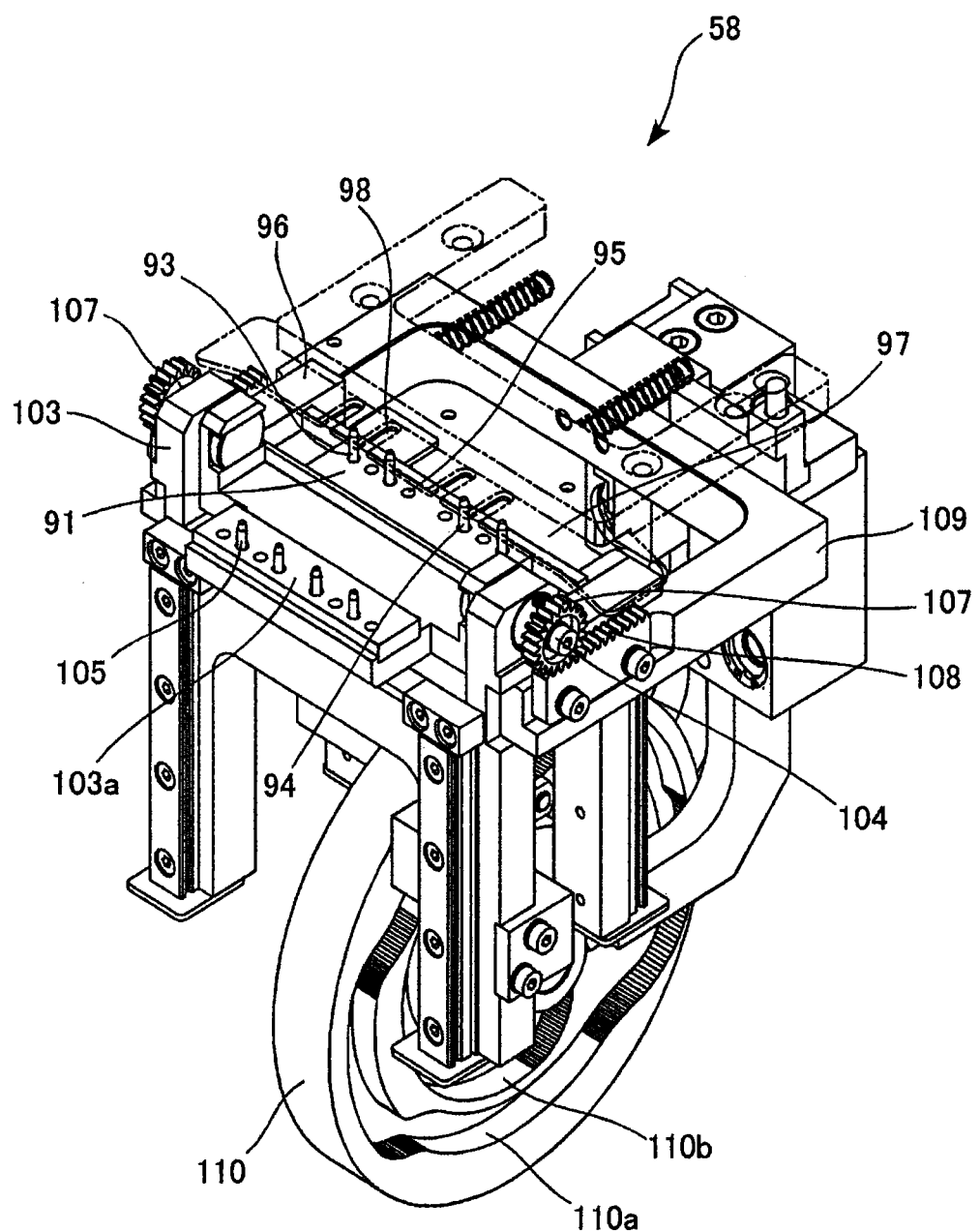
FIG. 25 is a perspective view showing the joining device of the splicing device.
Figure 26:
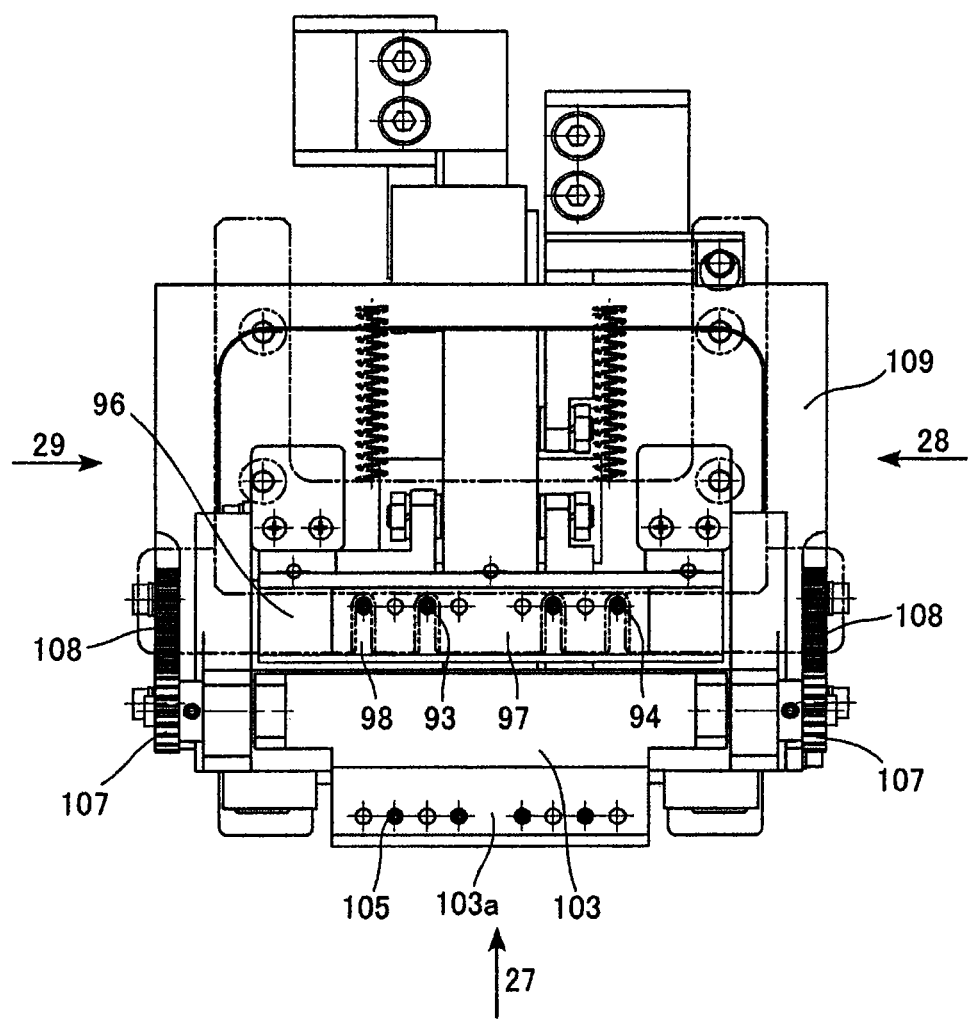
FIG. 26 is a top view showing the joining means.
Figure 27:
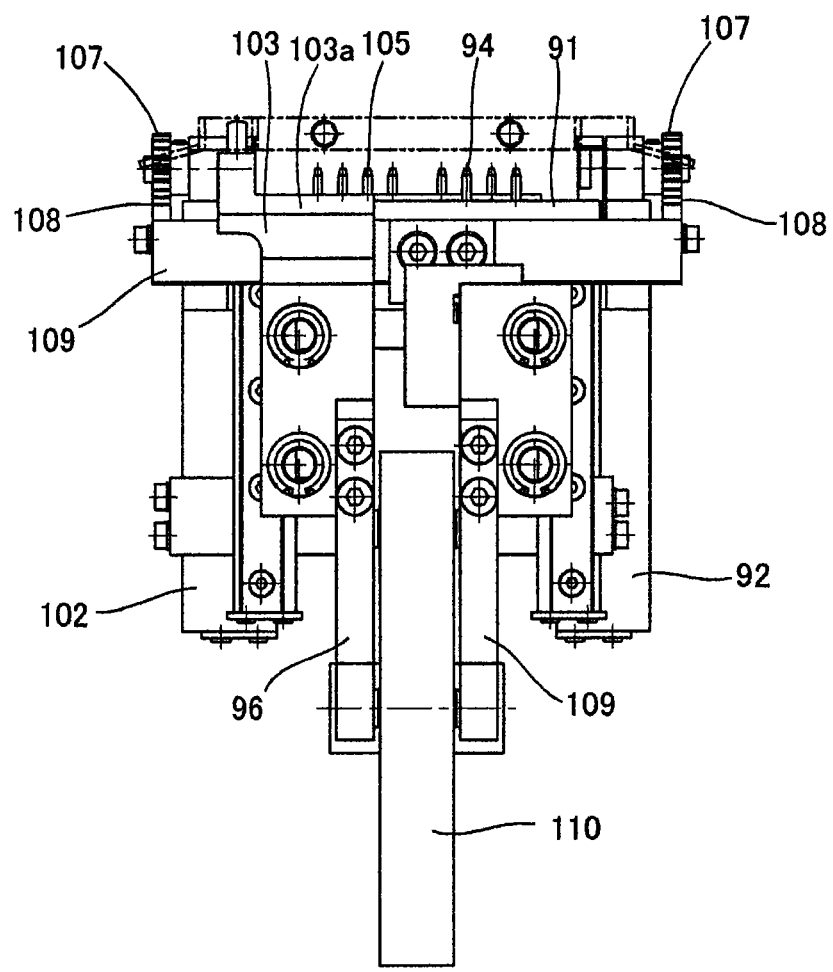
FIG. 27 is a front view from the direction of arrow 27 of FIG. 26.

Control device 59 judges whether a detection signal is received from number one and number two cutter detection devices 74a and 74b, in other words, judges whether cutting of number one and number two cutting points Q1 and Q2 of number one and number two carrier tapes T1 and T2 by number one and number two cutters 68a and 68b has been completed (step S16). Then, when a detection signal is received from number one and number two cutter detection devices 74a and 74b, as shown in FIG. 23, number one and number two movable members 77a and 77b of number one and number two takeup members 75a and 75b are moved down and respectively positioned (step S17) at number one and number two conveyance positions Ra1 and Ra2. Then, as shown in FIG. 24, rotation is started (step S18) respectively of number one and number two sprockets 61a and 61b, and number one and number two cutting points Q1 and Q2 of number one and number two carrier tapes T1 and T2 are respectively moved (step S19) by just number three and number four distances D3 and D4 between splicing position Ls and number one and number two cutting positions Lc1 and Lc2. Then, rotation is stopped respectively of number one and number two sprockets 61a and 61b and the conveyance position of number one and number two cutting points Q1 and Q2 is decided at splicing position Ls.

A positioning device which positions number one and number two carrier tapes T1 and T2 at splicing position LS at which positioning pins 93 and 94 engage with indexing holes Hc1 and Hc2 of number one and number two carrier tapes T1 and T2 is configured from the above number one and number two tape indexing devices 50 and 51, and the above step S19 and so on.

By this, the ends of number one and number two carrier tapes T1 and T2 inserted into number one and number two tape inlets 84a and 84b are positioned at splicing position LS without any deviation in pitch arising. By the above, splicing preparation processes are complete, so next the splicing process is performed.

The three-layer structure of base paper 32, splicing tape 30, and protective tape 31 wound around supply reel 33 is pulled out from supply reel 33 and base paper 32 is peeled and indexed by base paper indexing device 35. On the other hand, protective tape 31 affixed to splicing tape 30 is indexed by protective tape indexing device 36 and conveyed to splicing position LS.

When one of the two pieces making up one set of splicing tape 30a affixed to protective tape 31, in other words, splicing tape 30a formed with positioning holes 30a1, is detected by metal detection sensor 47, protective tape 31 is indexed from that detection position a fixed amount S1 by protective tape indexing device 36. By this, splicing tape 30a is positioned in a position capable of being engaged with number one positioning pins 93 and 94 of joining device 58 provided at splicing position LS, and in that state, the respective ends of number one and number two carrier tapes T1 and T2 are on standby until positioned at splicing position LS.

When number one and number two carrier tapes T1 and T2 are respectively positioned at predetermined points, cam drum 110 is rotated by a moving motor omitted from the figures. By the rotation of cam drum 110, first, number one raising/lowering platform 91 is raised via number one follower roller omitted from the figures which engages with number one cam groove 110*a*.

Figure 31:
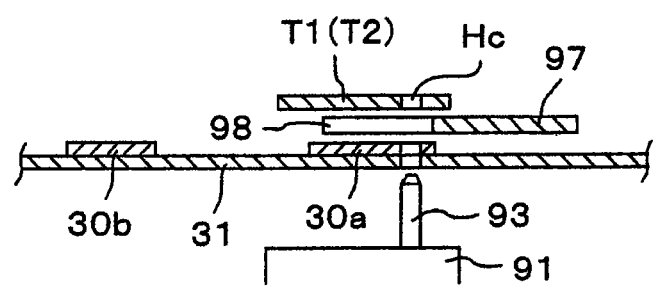
FIGS. 31(A), (B) and (C) are cross section views along the line 31-31 of FIG. 29 showing the splicing operation.
Figure 31:
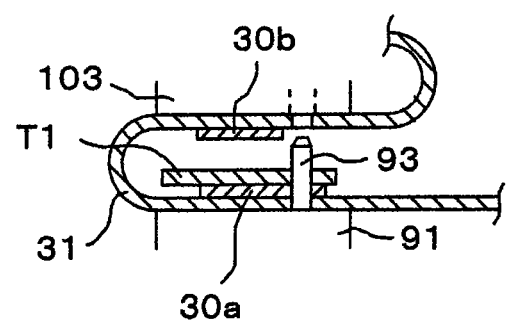
Figure 31:
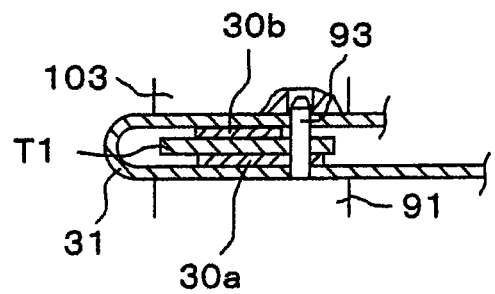

By the raising of number one raising/lowering platform 91, number one positioning pins 93 and 94 respectively engage with each indexing hole Hc of the two carrier tapes T1 and T2, and positioning holes 30*a*1 of splicing tape 30*a*. Here, between splicing tape 30*a* and carrier tapes T1 and T2, as shown in FIG. 31 (A), because retainer plate 97 is present, carrier tapes T1 and T2 do not get attached to splicing tape 30*a*. By this, a fixed three-way positional relationship is maintained between the two carrier tapes T1 and T2 and splicing tape 30*a* which is to connect them.

Next, via number two follower roller omitted from the figures engaging with number two cam groove 110*b*, moving platform 96 is moved in a horizontal direction, and retainer plate 97 present between splicing tape 30*a* and carrier tapes T1 and T2 is retracted with respect to number one raising/lowering platform 91, such that splicing tape 30*a* and carrier tapes T1 and T2 can be connected.

Figure 28:
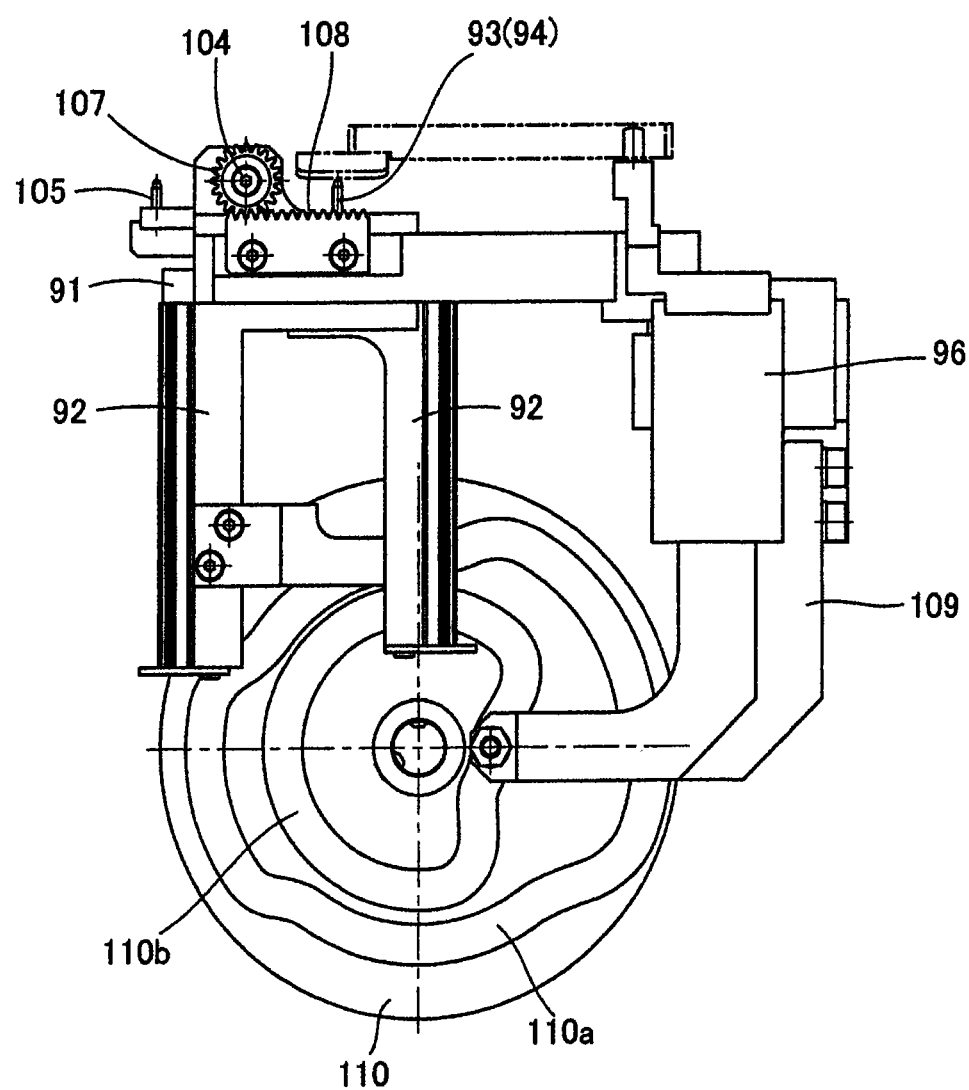
FIG. 28 is a right side view from the direction of arrow 28 of FIG. 26.
Figure 29:
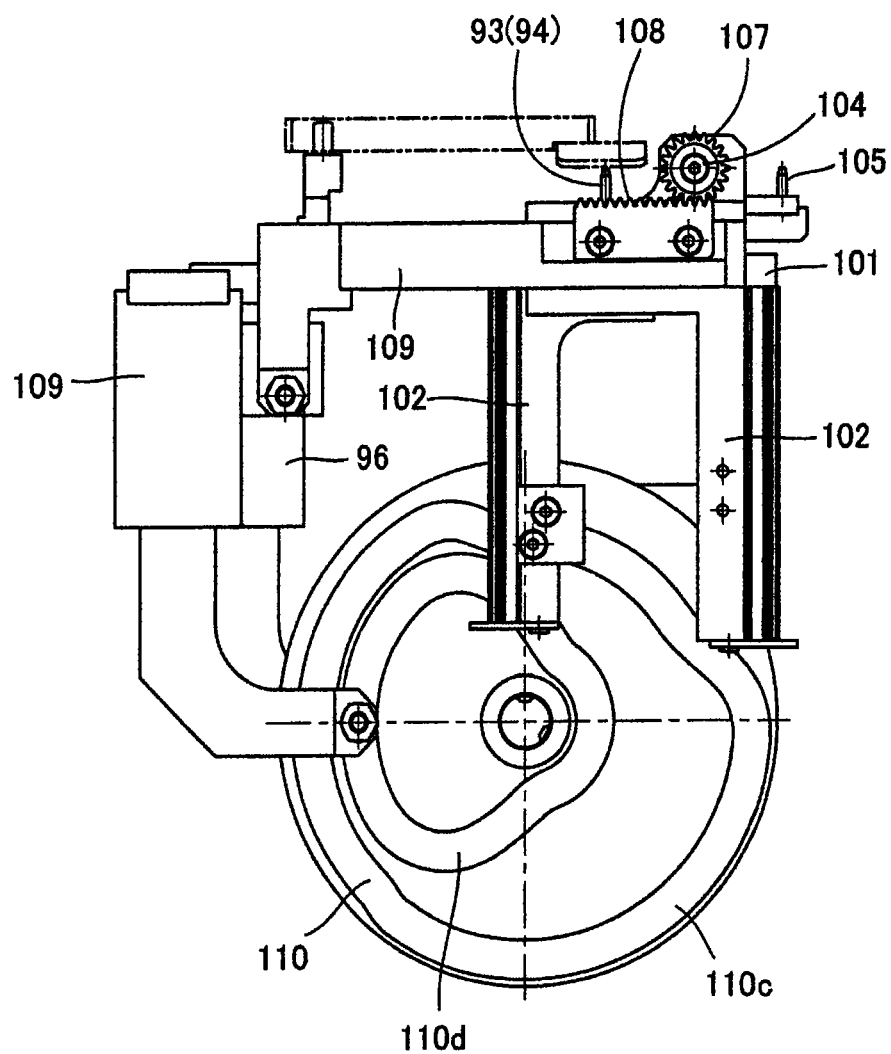
FIG. 29 is a left side view from the direction of arrow 29 of FIG. 26.

Next, via number three follower roller omitted from the figures which engages with number three cam groove 110*c*, moving platform 109 is moved horizontally, and rotating platform 103 is rotated in the clockwise direction of FIG. 28 by the horizontal movement of this moving platform 109 by rack and pinion mechanism (107 and 108). By the rotation of this rotating platform 103, as shown in FIG. 31 (B), protective tape 31 engaged with number two positioning pins 105 is folded, and the other splicing tape (30*b*) of the one set made from two pieces is flipped so that the attachment surface is facing down in a position below carrier tapes T1 and T2. In other words, protective tape 31 is folded to sandwich carrier tapes T1 and T2, and one splicing tape 30*a* is positioned below carrier tapes T1 and T2, and the other splicing tape 30*b* is positioned above carrier tapes T1 and T2. Here, the motor of protective tape indexing device 36 is reverse rotated, so slack is provided to protective tape 31 to allow protective tape 31 to be folded.

Continuing, number two raising/lowering platform 101 is lowered via number four follower roller omitted from the figures which engages with number four cam groove 110*d*. When number two raising/lowering platform 101 is lowered, as shown in FIG. 31 (C), number two positioning pins 105 are engaged from the reverse side of protective tape 31 with positioning holes 31*b* of protective tape 31, indexing holes Hc of carrier tapes T1 and T2, and positioning holes 30*a*1 of splicing tape 30*a*.

Further, by the lowering of number two raising/lowering platform 101, with carrier tapes T1 and T2 sandwiched, folded protective tape 31 is pressed between pressing plate 103*a* of rotating platform 103 and number one raising/lowering platform 91. By this pressing, one of splicing tape 30*a* affixed to protective tape 31 is attached to the lower surface (bottom surface) of carrier tapes T1 and T2 straddling thereof, and the other splicing tape 30*b* is attached to each cover tape Tt on the upper surface of carrier tapes T1 and T2 straddling thereof, such that the tail end of number one carrier tape T1 and the leading end of number two carrier tape Ts2 are connected to each other. This pressing state is held for a fixed time (several seconds).

Because the connection of the two carrier tapes T1 and T2 using splicing tape 30 is performed in a state in which relative deviation is limited by carrier tapes T1 and T2 and splicing tapes 30*a* and 30*b* being held by number one and number two positioning pins 93, 94, and 105, the two carrier tapes T1 and T2 can be joined accurately without any pitch deviation arising.

The above joining of the two carrier tapes T1 and T2 using splicing tape 30 is completed by the approximately 180 degree rotation of cam drum 110, and each configuration member returns to its original position through the reverse operation to the above by the rotation through the remaining 180 degrees.

In other words, first, along with number two raising/lowering platform 101 being raised, rotating platform 103 being raised with respect to number one raising/lowering platform 91, and the pressing of folded protective tape 31 being released, number two positioning pins 105 are separated from positioning holes 30*a*1 of splicing tape 30*a* and each indexing hole Hc of number one and number two carrier tapes T1 and T2. Here, because the adhesion with respect to carrier tapes T1 and T2 of splicing tape 30 is high, protective tape 31 is easily separated from splicing tape 30 thanks to the spring return power of protective tape 31 due to the release of the pressing of protective tape 31, and splicing tape 30 does not get peeled from carrier tapes T1 and T2.

Continuing, along with rotating platform 103 being rotated in the counterclockwise direction of FIG. 28 via the rack and pinion mechanism (108 and 107), protective tape indexing motor 36 is rotated in the normal direction and the slack in protective tape 31 is eliminated.

Then, along with retainer plate 97 being advanced, number one raising/lowering platform 91 is lowered, and number one positioning pins 93 and 94 are separated from positioning holes 30*a*1 of splicing tape 30*a* and each indexing hole Hc of the two carrier tapes T1 and T2. On the other hand, at base paper indexing device 35, the motor is driven, tension is applied to base paper 32, and just the required amount of base paper 32 is peeled. In this manner, the joining of the tail end of number one carrier tape T1 and the leading end of number two carrier tape T2 is completed.

When the two carrier tapes T1 and T2 are joined to each other using splicing tape 30, lid 22 of splicing device 20 is opened, and spliced number one and number two carrier tapes T1 and T2 are removed from splicing device 20. Then, reel 12 wound with number two carrier tape T2 is set on tape feeder 10, and splicing processing is completed. By this, components are replenished to tape feeder 10, and component mounting work can be performed continuously at the component mounter without stopping the machine.

Because metal powder is embedded in splicing tape 30 connected to carrier tapes T1 and T2, the splicing position can be detected easily by providing a metal detection sensor on tape feeder 10.

According to the above configuration, the cutting of the carrier tapes and the joining with splicing tape 30 for splicing the two carrier tapes T1 and T2 can be performed automatically, and it is possible to eliminate deviation in the pitch of the connection sections of the two carrier tapes T1 and T2 which arises during conventional manual work. By this, the occurrence of pickup errors and image processing errors due to deviation in the pitch of the connection sections can be controlled.

Further, by performing splicing automatically, the time required for splicing can be reduced, and by this, splicing processing can be completed without stopping the component mounter, and, as well as controlling the occurrence of image processing error and the occurrence of pickup errors, the efficiency of the component mounter can be improved by a large amount.

Also, because splicing tape 30 and the two carrier tapes T1 and T2 positioned at a fixed splicing position are engaged with each other by positioning pins 93 and 94, when the two carrier tapes T1 and T2 are joined, splicing tape 30 can be joined at an accurate position with respect to the two carrier tapes T1 and T2, and the splicing accuracy can be improved.

According to the above embodiment, because connected base paper 32 is attached to the adhesive surface of splicing tape 30 and supply reel 33 wound with base paper 32, splicing tape 30 and protective tape 31 in a roll shape is used, it is possible to supply many splicing tapes 30 to joining device 58 by supply reel 33 being set on splicing device 20, and it is easy to perform supply of splicing tape 30 to the splicing position.

For the above embodiment, an example was given in which the three-layer structure of base paper 32, splicing tape 30, and protective tape 31 was wound around supply reel 33 in a roll shape, but it is possible to do without base paper 32 and use even more splicing tapes 30 on supply reel 33 by having a two-layer structure of splicing tape 30 and protective tape 31. In this case, the attachment surface (the surface to be attached to carrier tapes T1 and T2) of splicing tape 30 contacts the reverse surface of protective tape 31 wound in a roll shape, but by considering the adhesive, it is possible to avoid peeling splicing tape 30 when pulling out protective tape 31.

Also, according to the above embodiment, an example was given in which each configuration member of joining device 58 is moved mechanically using cam drum 110 so that protective tape 31 is folded and splicing tape 30 joined to carrier tapes T1 and T2, but it is also possible to operate each configuration member of joining device 58 separately using actuators.

According to the above embodiment, because metal powder is embedded in splicing tape 30 and the position of splicing tape 30 is determined at the splicing position based on the signal of metal detection sensor 47 which detects the metal, the position of splicing tape 30 can be accurately determined at the splicing position without being affected by factors such as stretch in protective tape 31.

In such ways, the present invention is not limited to the configurations provided in the embodiment and there are various possible embodiments which do not extend beyond the range of the object of the present invention as given in the claims.

REFERENCE SIGNS LIST

10: Tape feeder; 12: Reel; 20: Splicing device; 21: Housing; 22: Lid; 30 (30a, 30b): Splicing tape; 31: Protective tape; 32: Base paper; 33: Supply reel; 35: Base paper indexing device; 36: Protective tape indexing device; 46: Reel for indexing; 47: Metal detection sensor; 50, 51: Tape indexing device; 54, 55: Cutting device; 58: Joining device; T1, T2: Carrier tape; Hc1, Hc2: Indexing holes; Tt: Cover tape

The invention claimed is:

1. A splicing device which connects a number one carrier tape and a number two carrier tape each provided with cavities for storing components and indexing holes at fixed intervals using a splicing tape, comprising:
   number one and number two cutting devices for respectively cutting at a predetermined cutting position a tail end of the number one carrier tape and a leading end of the number two carrier tape;
   a positioning device for indexing the number one and number two carrier tapes cut by the number one and number two cutting devices in an indexing direction towards each other and for positioning them at a splicing position, the positioning device including positioning pins that engage in the indexing holes of the number one carrier tape and the indexing holes of the number two carrier tape; and
   a joining device which, at the splicing position, uses the splicing tape indexed in a direction perpendicular to the indexing direction of the number one and number two carrier tapes, wherein
   the splicing tape includes a first piece and a second piece that are each connected to a protective tape on a first side of the splicing tape and an attachment surface of the splicing tape that is configured to be connected to the number one and number two carrier tapes is on a second side of the splicing tape,
   with the splicing tape positioned at the splicing position, the joining device engages the first piece by the positioning pins and joins the first piece to a top surface of the number one and the number two carrier tapes, and
   the joining device folds the protective tape, engages the second piece by the positioning pins, and joins the second piece to a bottom surface of the number one and number two carrier tapes.

2. The splicing device from claim 1, wherein a base paper is attached to the attachment surface of the splicing tape, and a supply reel includes the base paper, the splicing tape, and the protective tape wound in a roll.

3. The splicing device from claim 1, wherein a metal is embedded in the splicing tape, and the protective tape is indexed a predetermined amount and the position of the splicing tape is determined at the splicing position based on a signal of a metal detection sensor that detects the metal.

4. The splicing device from claim 1, wherein the joining device has an engaging member which engages with and moves the positioning pins of the positioning device.

5. A splicing method which connects a number one carrier tape and a number two carrier tape each provided with cavities for storing components and indexing holes at fixed intervals using a splicing tape, the method comprising:
   cutting a tail end of the number one carrier tape and a leading end of the number two carrier tape respectively at a predetermined cutting position;
   indexing with positioning pins provided at a splicing position a protective tape connected to the splicing tape in a direction perpendicular to an indexing direction of the number one and number two carrier tapes, a position of the splicing tape connected to the protective tape being determined at the splicing position;
   indexing the cut number one and number two carrier tapes in a direction towards each other, by engaging indexing holes of the number one carrier tape and indexing holes of number two carrier tape with the positioning pins;
   joining a first piece of the splicing tape engaged with the positioning pins to a first surface of each of the number one and number two carrier tapes; and
   folding back the protective tape, engaging the positioning pins with a second piece of the splicing tape, and joining the second piece of the splicing tape to a top surface of each of the number one and number two carrier tapes.

* * * * *